United States Patent
Breton et al.

(10) Patent No.: US 9,005,484 B2
(45) Date of Patent: Apr. 14, 2015

(54) LOW POLARITY NANO SILVER GELS

(75) Inventors: Marcel P. Breton, Mississauga (CA); Yiliang Wu, Oakville (CA); Naveen Chopra, Oakville (CA); Jennifer L. Belelie, Oakville (CA); Stephan V. Drappel, Toronto (CA)

(73) Assignee: Xerox Corporation, Norwalk, CT (US)

( * ) Notice: Subject to any disclaimer, the term of this patent is extended or adjusted under 35 U.S.C. 154(b) by 735 days.

(21) Appl. No.: 12/415,203

(22) Filed: Mar. 31, 2009

(65) Prior Publication Data

US 2010/0247783 A1    Sep. 30, 2010

(51) Int. Cl.

| | | |
|---|---|---|
| *H01B 1/02* | (2006.01) | |
| *C09D 11/00* | (2014.01) | |
| *C09D 11/033* | (2014.01) | |
| *C09D 5/24* | (2006.01) | |
| *C09D 11/34* | (2014.01) | |
| *C09D 11/36* | (2014.01) | |
| *C09D 11/52* | (2014.01) | |
| *H05K 1/09* | (2006.01) | |

(52) U.S. Cl.
CPC ............... *C09D 11/033* (2013.01); *C09D 5/24* (2013.01); *C09D 11/34* (2013.01); *C09D 11/36* (2013.01); *C09D 11/52* (2013.01); *H05K 1/097* (2013.01); *H05K 2203/0783* (2013.01); *H05K 2203/122* (2013.01)

(58) Field of Classification Search
CPC ............... H01B 1/12; B05D 5/12; B41F 5/24; B41M 3/006; C09D 1/00; C09D 19/10; C09D 11/38
USPC ............. 252/512, 513, 514; 106/270, 287.18, 106/31.61; 427/383.1
See application file for complete search history.

(56) References Cited

U.S. PATENT DOCUMENTS

| | | |
|---|---|---|
| 5,496,879 A | 3/1996 | Griebel et al. |
| 5,645,632 A | 7/1997 | Pavlin |
| 5,783,657 A | 7/1998 | Pavlin et al. |
| 5,863,319 A | 1/1999 | Baker et al. |
| 5,998,570 A | 12/1999 | Pavlin et al. |
| 6,111,055 A | 8/2000 | Berger et al. |
| 6,472,523 B1 | 10/2002 | Banning et al. |
| 6,476,219 B1 | 11/2002 | Duff et al. |
| 6,576,747 B1 | 6/2003 | Carlini et al. |
| 6,576,748 B1 | 6/2003 | Carlini et al. |
| 6,590,082 B1 | 7/2003 | Banning et al. |
| 6,646,111 B1 | 11/2003 | Carlini et al. |
| 6,663,703 B1 | 12/2003 | Wu et al. |
| 6,673,139 B1 | 1/2004 | Wu et al. |
| 6,696,552 B2 | 2/2004 | Mayo et al. |
| 6,713,614 B2 | 3/2004 | Carlini et al. |
| 6,726,755 B2 | 4/2004 | Titterington et al. |
| 6,755,902 B2 | 6/2004 | Banning et al. |
| 6,761,758 B2 | 7/2004 | Boils-Boissier et al. |
| 6,811,595 B2 | 11/2004 | Boils-Boissier et al. |
| 6,821,327 B2 | 11/2004 | Jaeger et al. |
| 6,860,928 B2 | 3/2005 | Breton et al. |
| 6,872,243 B2 | 3/2005 | Breton et al. |
| 6,906,118 B2 | 6/2005 | Goodbrand et al. |
| 6,958,406 B2 | 10/2005 | Banning et al. |
| 7,053,227 B2 | 5/2006 | Jaeger et al. |
| 7,270,694 B2 | 9/2007 | Li et al. |
| 7,276,614 B2 | 10/2007 | Toma et al. |
| 7,279,587 B2 | 10/2007 | Odell et al. |
| 7,381,831 B1 | 6/2008 | Banning et al. |
| 7,427,323 B1 | 9/2008 | Birau et al. |
| 7,648,654 B2 * | 1/2010 | Lee et al. ...................... 252/512 |
| 2006/0222985 A1 | 10/2006 | Tsubuko et al. |
| 2007/0012217 A1 | 1/2007 | Goredema et al. |
| 2007/0099357 A1 | 5/2007 | Li et al. |
| 2007/0119340 A1 | 5/2007 | Breton et al. |
| 2007/0120919 A1 | 5/2007 | Goredema et al. |
| 2007/0123606 A1 | 5/2007 | Toma et al. |
| 2007/0244220 A1 | 10/2007 | Kim et al. |
| 2007/0283846 A1* | 12/2007 | Breton et al. ............... 106/31.61 |
| 2008/0218570 A1 | 9/2008 | Kovacs et al. |
| 2009/0078915 A1 | 3/2009 | Lee et al. |

FOREIGN PATENT DOCUMENTS

| | | |
|---|---|---|
| DE | 42 05 636 A1 | 8/1993 |
| DE | 42 05 713 A1 | 8/1993 |
| WO | WO 98/17705 A1 | 4/1998 |

OTHER PUBLICATIONS

European Search Report, in European Patent Application No. 10157219.6-2102, dated Jul. 20, 2010.
U.S. Appl. No. 12/133,548, filed Jun. 5, 2008.
U.S. Appl. No. 11/950,450, filed Dec. 5, 2007.
U.S. Appl. No. 12/013,539, filed Jan. 14, 2008.
U.S. Appl. No. 12/408,897, filed Mar. 20, 2009.
U.S. Appl. No. 12/113,628, filed May 1, 2008.
Office Action dated Dec. 11, 2013 issued in Chinese Patent Application No. 201010139963.1 (with translation).
May 31, 2013 Chinese Office Action issued in Chinese Patent Application No. 201010139963.1 (with translation).

* cited by examiner

*Primary Examiner* — Monique Peets
(74) *Attorney, Agent, or Firm* — Pillsbury Winthrop Shaw Pittman LLP

(57) ABSTRACT

A composition that includes an stabilized silver nanoparticles, a gellant and an optional wax. The gellant and the stabilized silver nanoparticles are soluble or dispersable in either an isoparaffinic hydrocarbon solvent, a mineral oil solvent or an alkane solvent.

19 Claims, No Drawings

LOW POLARITY NANO SILVER GELS

BACKGROUND

Fabrication of electronic circuit elements using metal nanoparticle liquid deposition techniques is of profound interest as such techniques provide potentially low-cost alternatives to conventional mainstream amorphous silicon technologies for electronic applications such as thin-film transistors (TFTs), light-emitting diodes (LEDs), RFID tags, photovoltaics. However, the deposition and/or patterning of functional electrodes, pixel pads, and conductive traces, lines and tracks which meet the conductivity, processing, and cost requirements for practical applications have been a great challenge.

Furthermore, phase change inks (sometimes referred to as "hot melt inks") have also been used in various liquid deposition techniques. Phase change inks often contain a "phase change agent" that enables the ink to exist in a solid phase at ambient temperatures, but also exist in the liquid phase at the elevated operating temperature of an ink jet printing device. At the deposit operating temperature, droplets of liquid ink are ejected from the printing device and, when the ink droplets contact the surface of the recording substrate, either directly or via an intermediate heated transfer belt or drum, they quickly solidify to form a predetermined pattern of solidified ink drops. Phase change inks have also been used in other printing technologies, such as gravure printing, as disclosed in, for example, U.S. Pat. No. 5,496,879 and German Patent Publications DE 4205636AL and DE 4205713AL, the disclosures of each of which are totally incorporated herein by reference.

Phase change inks are desirable for ink jet printers because they remain in a solid phase at room temperature during shipping, long term storage, and the like. In addition, the problems associated with nozzle clogging as a result of ink evaporation with liquid ink jet inks are largely eliminated, thereby improving the reliability of the ink jet printing. Further, in phase change ink jet printers wherein the ink droplets are applied directly onto the final recording substrate (for example, paper, transparency material, and the like), the droplets solidify immediately upon contact with the substrate, so that migration of ink along the printing medium is prevented and dot quality is improved.

U.S. Patent Application Pub. No. 2007/0283846, which is incorporated herein by reference in its entirety, discloses a non-conductive organic phase change carrier comprising a colloidal dispersion of nanoparticles in a polar curable monomer, a phase-change inducing component and an initiator. In one embodiment, the nanoparticles are at least one of silicon nanoparticles and metal oxide nanoparticles. Upon exposure to UV light and/or heat, a solid is obtained and there is none of the component can be evaporated if heated.

U.S. Patent Application Pub. No. 2007/0119340, which is incorporated herein by reference in its entirety, discloses an ink carrier comprised of a colloidal dispersion of at least one of silica nanoparticles and metal oxide nanoparticles, the ink carrier further including a low melting wax and a gellant, wherein gel formation occurs at a temperature above the crystallization temperature of the wax. The ink described does not contain any liquid vehicle or solvent.

SUMMARY

There is therefore a need for a low polarity conductive composition that improves shelf stability and ink adhesion on a variety of substrates, yet further minimizes film cracking during annealing, have a minimum effect on film conductivity and can meet the requirements for inkjet, flexography and screen printing applications.

The above and other issues are addressed by the present application, wherein in embodiments, the application relates to a composition comprising: stabilized silver nanoparticles, a gellant and a optional wax, wherein the gellant and the stabilized silver nanoparticles are in the presence of a solvent selected from the group consisting of an isoparaffinic hydrocarbon, a mineral oil and an alkane, and mixtures thereof.

In further embodiments, described herein is a method of forming conductive features on a substrate, the method comprising: providing a solution comprised of stabilized silver nanoparticles, a gellant, an optional wax and a solvent, depositing the solution onto the substrate, and heating the solution on the substrate to a temperature from about 120° C. to about 250° C. to form conductive features on the substrate, and wherein the solvent is selected from the group consisting of an isoparaffinic hydrocarbon, a mineral oil and an alkane, and mixtures thereof.

EMBODIMENTS

Described herein is a composition with a sufficient amount of loading and viscosity to be used in inkjet, flexographic and screen printing applications. The composition is comprised of stabilized silver nanoparticles, a gellant and a optional wax. Furthermore, the gellant and stabilized silver nanoparticles are respectively soluble and dispersable in a solvent selected from the group consisting of an isoparaffinic hydrocarbon, a mineral oil and an alkane, and mixtures thereof.

The term "nano" as used in "metal nanoparticles" refers to, for example, a particle size of less than about 1,000 nm, such as, for example, from about 0.5 nm to about 1,000 nm, for example, from about 1 nm to about 500 nm, from about 1 nm to about 100 nm, from about 1 nm to about 25 nm or from about 5 to about 25 nm. The particle size refers to the average diameter of the metal particles, as determined by TEM (transmission electron microscopy) or other suitable method.

The silver nanoparticle solution herein includes silver nanoparticles in a liquid system. The nanoparticle solution may also be composed of (i) one or more metals or (ii) one or more metal composites that include silver. Suitable additional metals may include, for example, Al, Au, Pt, Pd, Cu, Co, Cr, In, and Ni, particularly the transition metals, for example, Au, Pt, Pd, Cu, Cr, Ni, and mixtures thereof. Suitable metal composites may include Au—Ag, Ag—Cu, Ag—Ni, Au—Ag—Cu, and Au—Ag—Pd. The silver composites may include non-metals, such as, for example, Si, C, and Ge. The various components of the silver composite may be present in an amount ranging for example from about 0.01% to about 99.9% by weight, particularly from about 10% to about 90% by weight. In embodiments, the silver composite is an alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the silver nanoparticles do not include the stabilizer.

The silver nanoparticles may be a mixture of two or more bimetallic metal nanoparticle species, such as those described in commonly assigned U.S. patent application Ser. No. 12/113,628 to Naveen Chopra et al. filed May 1, 2008, which is incorporated herein by reference in its entirety, or a bimodal metal nanoparticle, such as those described in U.S. patent application Ser. No. 12/133,548 to Michelle N. Chretien filed Jun. 5, 2008, which is also herein incorporated by reference in its entirety.

In embodiments, the silver nanoparticles have a stability (that is, the time period where there is minimal precipitation or aggregation of the silver-containing nanoparticles) of, for example, at least about 1 day, or from about 3 days to about 1 week, from about 5 days to about 1 month, from about 1 week to about 6 months, from about 1 week to over 1 year. Stability is further enhanced as the compositions described herein are not liquid but are gel compositions under certain conditions, more specifically near room temperature.

The silver nanoparticles solution may contain an organic stabilizer that is connected to the surface of the silver nanoparticles and is not removed in part or in full until the annealing of the silver nanoparticles during formation of silver features on a substrate.

In embodiments, the stabilizer complex is physically or chemically associated with the surface of the silver nanoparticles. In this way, the silver nanoparticles have the stabilizer thereon outside of a liquid system. That is, the nanoparticles with the stabilizer thereon, may be isolated and recovered from the reaction mixtures solution used in forming the nanoparticles and stabilizer complex. The stabilized nanoparticles may thus be subsequently readily and homogeneously dispersed in a liquid system for forming a printable solution.

As used herein, the phrase "physically or chemically associated" between the silver nanoparticles and the stabilizer can be a chemical bond and/or other physical attachment. The chemical bond can take the form of, for example, covalent bonding, hydrogen bonding, coordination complex bonding, or ionic bonding, or a mixture of different chemical bonds. The physical attachment can take the form of, for example, van der Waals' forces or dipole-dipole interaction, or a mixture of different physical attachments. In embodiments, The term "organic" in "organic stabilizer" refers to, for example, the presence of carbon atom(s), but the organic stabilizer may include one or more non-metal heteroatoms such as nitrogen, oxygen, sulfur, silicon, halogen, and the like. The organic stabilizer may be an organoamine stabilizer such as those describe in U.S. Pat. No. 7,270,694, which is incorporated by reference herein in its entirety. Examples of the organoamine are an alkylamine, such as for example methylamine, ethylamine, propylamine, butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof. In embodiments, the silver nanoparticles are organoamine-stabilized silver nanoparticles.

Examples of other organic stabilizers include, for example, thiol and its derivatives, —OC(=S)SH (xanthic acid), polyethylene glycols, polyvinylpyridine, polyninylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine that can stabilize silver nanoparticles can also be used as a potential stabilizer.

Further examples of organic stabilizers may include: the carboxylic acid-organoamine complex stabilized metal nanoparticles, described in U.S. patent application Ser. No. 11/950,450 to Yuning Li filed Dec. 5, 2007; the carboxylic acid stabilizer metal nanoparticles described in U.S. Pub. No. 20070099357 A1, and the thermally removable stabilizer and the UV decomposable stabilizers described in U.S. patent application Ser. No. 12/013,539 to Yuning Li filed Jan. 14, 2008, each of which are incorporated by reference herein in their entirety.

The extent of the coverage of stabilizer on the surface of the silver nanoparticles can vary, for example, from partial to full coverage depending on the capability of the stabilizer to stabilize the silver nanoparticles. Of course, there is variability as well in the extent of coverage of the stabilizer among the individual silver nanoparticles.

The weight percentage of the organoamine stabilized silver nanoparticles in the composition may be from, for example, about 5 weight percent to about 80 weight percent, from about 10 weight percent to about 60 weight percent, from about 15 weight percent to about 50 weight percent or from about 25 weight percent to about 35 weight percent.

As used herein, the phrase "low polarity" in the low polarity conductive composition refers to compositions that have a solubility parameter of less than 21 $(MPa)^{1/2}$, in some embodiments in the range of 15 to 19 $(MPa)^{1/2}$.

The composition includes a gellant and/or a wax as the phase-change agent. The inclusion of a phase change agent allows the compositions to "phase change" or undergo a sharp increase in viscosity over a narrow temperature range upon cooling the composition to a temperature above room temperature, and harden to a gel-like consistency, which is retained as the compositions are cooled further to room temperature. For example, some phase change inks that may be suitable for use in the devices and methods of the present disclosure have a viscosity which changes by a factor of about $10^2$ to about $10^9$ over a temperature change of only about $10°$ C. to about $50°$ C.

The phase change agent may generally be any component that is miscible with the other components of the phase change ink and promotes the increase in viscosity of the ink as it cools from the depositing temperature to the substrate temperature.

In embodiments, the inclusion of a phase change agent in the composition may result in a change in viscosity of at least about $10^2$ centipoise (cP), for example, from about $10^3$ cP to about $10^7$ cP and from about $10^3$ cP to about $10^6$ cP over a temperature range of, for example, in one embodiment at least about $20°$ C., for example, from about $40°$ C. to about $120°$ C., from about $60°$ C. to about $100°$ C. or about $70°$ C. to about $95°$ C.

In embodiments, a gellant is used as the phase change agent. Various compositions, such as inks, containing gellants are described in U.S. Pat. Nos. 6,906,118, 6,761,758, 6,811,595, 6,860,928, and 6,872,243, the disclosures of which are incorporated herein in their entirety by reference. The gellant compositions disclosed herein can affect the viscosity of the composition within a desired temperature range. In particular, the gellant may form a semi-solid gel in the composition at temperatures below the specific temperature at which the composition is deposited.

The semi-solid gel phase is a physical gel that exists as a dynamic equilibrium comprising one or more solid gellant molecules and a liquid solvent. The semi-solid gel phase is a dynamic networked assembly of molecular components held together by non-covalent interactions such as hydrogen bonding, Van der Waals interactions, aromatic non-bonding interactions, ionic or coordination bonding, London dispersion forces, or the like, which, upon stimulation by physical forces, such as temperature, mechanical agitation, or the like, can undergo reversible transitions from liquid to semi-solid state at the macroscopic level. The solutions containing the gellant molecules exhibit a thermally reversible transition between the semi-solid gel state and the liquid state when the temperature is varied above or below the gel point of the solution. This reversible cycle of transitioning between semi-solid gel phase and liquid phase can be repeated many times in the solution formulation.

In a further embodiment, adding a gellant or a mixture of gellants can modify the rheological profile of the composition often recognized by the presence of one or more viscosity plateaus at temperatures above room temperature. This can be described as the gel state. In this state, the gelled inks exhibit visco-elastic rheological characteristics that are different from those of conventional hot melt or phase change inks in that they show an elastic behavior in a temperature region where the ink is supposed to be in the liquid state. The gel state can have a gel point, associated with the onset of gelation upon cooling. The gel point is evidenced by the crossover of G' (storage modulus) and G" (loss modulus), with G' being higher than G", indicating that the material is elastic. When more than one gellant is used in the gellant composition, it is expected that the viscosity in the plateau region of the first gellant is at least one order of magnitude lower than the viscosity in the second plateau region. Optionally, the compositions may contain a mixture of more than one gellants, wherein the gellants may be selected from the amorphous or crystalline types.

At low depositing temperatures, the conventional use of temperature differential between the deposited composition and the substrate upon which the composition is deposited in order to effect a rapid phase change in the composition (that is from liquid to solid) may not be effective. The gellant can thus be used to effect a rapid viscosity increase in the deposited composition upon the substrate. In particular, deposited ink droplets would be pinned into position on a receiving substrate such as an image receiving medium (paper) or an intermediate transfer member (a transfuse drum or belt) that is at a temperature cooler than the ink depositing temperature of the ink through the action of a phase change transition in which the ink undergoes a significant viscosity change from a liquid state to a gel state (or semi-solid state).

Upon cooling, gelation can occur before room temperature or before the temperature of the substrate onto which the gel composition is deposited or coated. The "gel point" temperature in one embodiment is equal to or less than about 95° C., in another embodiment equal to or less than about 90° C., and in a further embodiment equal to or less than about 85° C., although the temperature can be outside of these ranges. If more than one gel transition is enabled by the use of more than one gellant, the first "gel point" can be from about 5° C. to about 60° C. below the subsequent transition. In some applications, it might be necessary to overlap the transitions, as a result the viscosity plateaus will not be apparent.

In embodiments, the temperature at which the composition forms the gel state is any temperature below the depositing temperature of the composition, for example, any temperature that is about 5° C. or more below the depositing temperature of the composition. In embodiments, the gel state may be formed at temperatures in one embodiment from about 25° C. to about 100° C., in another embodiment from about 30° C. to about 70° C., and in yet another embodiment from about 30° C. to about 50° C., although the temperature can be outside this range. There is a rapid and large increase in ink viscosity upon cooling from the depositing temperature at which the composition is in a liquid state, to the gel transition temperature, at which the composition converts to the gel state. The viscosity increase is in one embodiment at least a $10^{1.5}$-fold increase in viscosity.

When the compositions described herein are in the gel state, the viscosity of the composition is in one embodiment at least about 1,000 mPa·s, in another embodiment at least about 10,000 mPa·s, and in yet another embodiment at least about 100,000 mPa·s. Viscosity values in the gel state are in the range of in one embodiment from about $10^3$ to about $10^9$ mPa·s, and in another embodiment from about $10^{4.5}$ to about $10^{6.5}$ mPa·s, although the gel state viscosity can be outside of these ranges. The desired gel phase viscosity can vary with the print process. For example, the highest viscosities are desired when employing intermediate transfer, or when depositing directly to porous paper in order to minimize the effects of ink bleed and feathering. On the other hand, less porous substrates such as plastic may require lower viscosities that control dot gain and agglomeration of individual ink pixels. The gel viscosity can be controlled by the composition and substrate temperature.

The gellant may be a compound of the formula

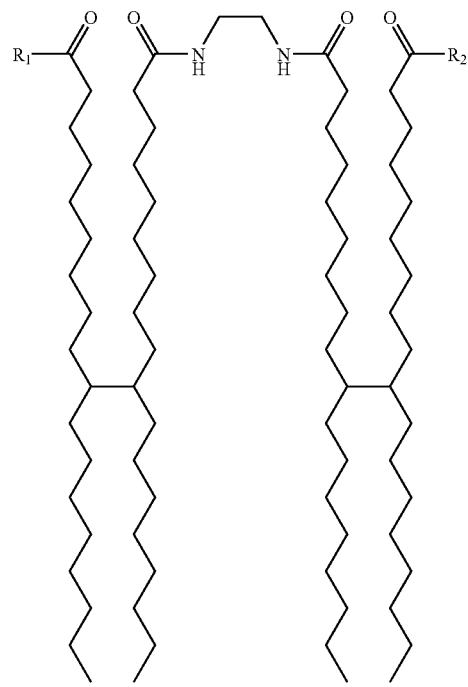

wherein $R_1$ and $R_2$ are side chains independently selected from the group consisting of a hydrogen atom, a hydrocarbon group, a heteroatom, and combinations thereof.

Unless otherwise indicated, in identifying the substituents for $R_1$ and $R_2$, the phrase "hydrocarbon group" encompasses both unsubstituted hydrocarbon groups and substituted hydrocarbon groups. The unsubstituted hydrocarbon group may contain, for example, from about 1 to about 20 carbon atoms, from about 5 to about 15 carbon atoms or from about 6 to about 10 carbon atoms. Examples of the unsubstituted hydrocarbon groups may include, for example, a straight chain alkyl group, a branched alkyl group, a cycloalkyl group, an aryl group, an alkylaryl group, and an arylalkyl group. Example alkyl groups may include, for example, methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomeric forms thereof.

The substituted hydrocarbon group may contain, for example, from about 1 to about 25 carbon atoms, from about 5 to about 20 carbon atoms and from about 6 to about 10 carbon atoms substituted with, for example, fluorine, bromine, chlorine, hydroxyl iodine, sulfur, amino, nitro, cyano, methoxyl, ethoxyl, propoxy, or combinations thereof. Substituted hydrocarbon groups may be, for example, a straight chain alkyl group, a branched alkyl group, a cycloalkyl group, an aryl group, an alkylaryl group, and an arylalkyl group with a heteroatom. Example alkyl groups may include, for example, methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomeric forms thereof. In embodiments, the hydrocarbon group may be optionally substituted alkyl and optionally substituted aryl.

Unless otherwise indicated, in identifying the substituents for $R_1$ and $R_2$, the term "heteroatom" includes fluorine, bromine, chlorine, iodine, sulfur, nitrogen, oxygen, or combinations thereof. Further the heteroatom can be a single atom such as, for example, chlorine or fluorine or the single atom contained in a compound such as, for example, the oxygen atom in the a hydroxyl compound (OH), the nitrogen atom (N) in an amino compound ($NH_2$) and the sulfur atom (S) in a $SO_2$ compound.

Any suitable gellant, such as those described in U.S. Pat. No. 7,279,587, the disclosure of which is incorporated herein by reference in its entirety, may be used for the composition disclosed herein. Specifically, the gellant can be selected from materials disclosed in U.S. Pat. No. 7,276,614, U.S. Patent Application Pub. No. 2007/0119340 and U.S. Patent Application Publication No. 2007/0123606, the disclosures of which are totally incorporated herein by reference.

An ester-terminated polyamide may also be employed as the gellant in the composition disclosed herein. The ester-terminated amide is a semi-crystalline gellant that forms a clear gel. Examples of suitable ester-terminated polyamide compounds and the preparation thereof are disclosed in, for example, U.S. Pat. No. 5,863,319, U.S. Pat. No. 5,645,632, and U.S. Pat. No. 5,783,657, each of which are incorporated herein by reference in its entirety. Suitable ester-terminated polyamides are also commercially available as, for example, UNI-REZ 2980 and UNICLEAR 80 and 100 (commercially available from Arizona Chemical), and the like.

Low molecular weight ester-terminated polyamides, such as those described in U.S. Pat. Nos. 5,783,657 and 5,998,570 and WO 98/17705, (Pavlin et al), each of which are incorporated herein by reference in its entirety, may be blended with a liquid hydrocarbon to form a transparent composition having gel consistency. The ester-terminated polyamide was prepared by reacting "x" equivalents of dicarboxylic acid (at least 50 percent of those x equivalents are from a polymerized fatty acid), "y" equivalents of diamine such as ethylene diamine and "z" equivalents of monoalcohol having at least 4 carbon atoms. The stoichiometry of the reaction mixture is such that $0.9 \leq \{x/(y+z)\} \leq 1.1$ and $0.1 \leq \{z/(y+z)\} \leq 0.7$. The reactants are heated until they reach reaction equilibrium.

Ester-terminated dimer acid based polyamides, such as those described in U.S. Pat. No. 6,111,055, the disclosure of which is incorporated by reference in its entirety, may be blended with a solvent to form a gel. The solvent may be flammable, and a wick may be added to the resulting gel to form a candle. The said ester terminated dimmer acid-based polyamide is prepared by thermal condensation of a diacid, a diamine and a monoalcohol.

Another example of an ester-terminated polyamide is an ester terminated oligo-amide, such as those described in U.S. Patent Application Pub. No. 2007/0012217, the disclosure of which is herein incorporated by reference in its entirety. The ester-terminated oligo-amide may have the following formula:

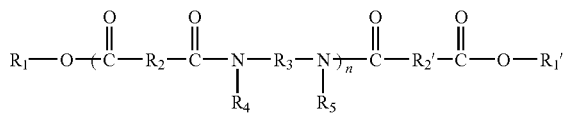

wherein n represents the number of repeating segments. In a further embodiment, n is an integer of 1, 2, 3, 4, 5, 6, 7, 8, 9 or 10. In yet a further embodiment, n is 2, 4, or 6. In one embodiment, $R_1$ and $R_1'$ are each, independently selected from the group comprising alkyl. In another embodiment, $R_1$ and $R_1'$ are each, independently, linear alkyl groups, branched alkyl groups, saturated alkyl groups, unsaturated alkyl groups, cyclic alkyl groups, substituted alkyl groups, unsubstituted alkyl groups, alkyl groups having hetero atoms, or aryl groups, or mixtures thereof. In a further embodiment, $R_2$ is and $R_2'$ are each, independently, each, alkylene, arylene, alkylarylene and arylalkylene, or mixtures thereof. In another embodiment, $R_3$ is alkylene, arylene, arylalkylene or alkylarylene, or mixtures thereof. In yet another embodiment, $R_4$ is and $R_5$ are each, independently, each, hydrogen or alkyl.

In another embodiment of this disclosure, $R_1$ and $R_1'$ of the ester-terminated oligo-amide is each, independently of the other, an alkyl group, an aryl group, an alkylaryl group and arylalkyl group. The alkyl group for $R_1$ and $R_1'$ may include linear, branched, saturated, unsaturated, cyclic, substituted, and unsubstituted alkyl groups, and wherein hetero atoms, such as oxygen, nitrogen, sulfur, silicon, phosphorus, boron, and the like either may be present in the alkyl group. The alkyl group for $R_1$ and $R_1'$ includes, in one embodiment, at least 1 carbon atom, and in another embodiment, at least about 4 carbon atoms, and in yet another embodiment at least about 10 carbon atoms, and, in one embodiment, no more than about 100 carbon atoms, in another embodiment no more than about 60 carbon atoms, and in yet another embodiment no more than about 30 carbon atoms, although the number of carbon atoms can be outside of these ranges, including (1) linear saturated unsubstituted aliphatic groups containing no hetero atoms, (2) branched saturated unsubstituted aliphatic groups containing no hetero atoms, (3) cyclic saturated unsubstituted aliphatic groups containing no hetero atoms, (4) aliphatic groups containing both cyclic and acyclic portions, said aliphatic groups being saturated, unsubstituted, and containing no hetero atoms, (5) linear ethylenically unsaturated unsubstituted aliphatic groups containing no hetero atoms, (6) branched ethylenically unsaturated unsubstituted aliphatic groups containing no hetero atoms, (7) cyclic ethylenically unsaturated unsubstituted aliphatic groups containing no hetero atoms, (8) aliphatic groups containing both cyclic and acyclic portions, said aliphatic groups being ethylenically unsaturated, unsubstituted, and containing no hetero atoms, (9) linear saturated substituted aliphatic groups containing no hetero atoms, (10) branched saturated substituted aliphatic groups containing no hetero atoms, (11) cyclic saturated substituted aliphatic groups containing no hetero atoms, (12) aliphatic groups containing both cyclic and acyclic portions, said aliphatic groups being saturated, substituted, and containing no hetero atoms, (13) linear ethylenically unsaturated substituted aliphatic groups containing no hetero atoms, (14) branched ethylenically unsaturated substituted aliphatic groups containing no hetero atoms, (15) cyclic ethylenically unsaturated substituted aliphatic groups containing no hetero atoms, (16) aliphatic groups containing both cyclic and acyclic portions, said aliphatic groups being ethylenically unsaturated, substituted, and containing no hetero atoms, (17) linear saturated unsubstituted aliphatic groups containing hetero atoms, (18) branched saturated unsubstituted aliphatic groups containing hetero atoms, (19) cyclic saturated unsubstituted aliphatic groups containing hetero atoms, (20) aliphatic groups containing both cyclic and acyclic portions, said aliphatic groups being saturated, unsubstituted, and containing hetero atoms, (21) linear ethylenically unsaturated unsubstituted aliphatic groups containing hetero atoms, (22) branched ethylenically unsaturated unsubstituted aliphatic groups containing hetero atoms, (23) cyclic ethylenically unsaturated unsubstituted aliphatic groups containing hetero atoms, (24) aliphatic groups containing both cyclic and acyclic portions, said aliphatic groups being ethylenically unsaturated, unsubstituted, and containing hetero atoms, (25) linear saturated substituted aliphatic groups containing hetero atoms, (26) branched saturated substituted aliphatic groups containing hetero atoms, (27) cyclic saturated substituted aliphatic groups containing hetero atoms, (28) aliphatic groups containing both cyclic and acyclic portions, said aliphatic groups being saturated, substituted, and containing hetero atoms, (29) linear ethylenically unsaturated substituted aliphatic groups containing hetero atoms, (30) branched ethylenically unsaturated substituted aliphatic groups containing hetero atoms, (31) cyclic ethylenically unsaturated substituted aliphatic groups containing hetero atoms, and (32) aliphatic groups containing both cyclic and acyclic portions, the aliphatic groups being ethylenically unsaturated, substituted, and containing hetero atoms.

The aryl group for $R_1$ and $R_1'$ may include substituted and unsubstituted aryl groups, and wherein hetero atoms, such as oxygen, nitrogen, sulfur, silicon, phosphorus, boron, and the like may be present in the aryl group. The aryl group for $R_1$ and $R_1'$ may include at least about 5 carbon atoms, and in another embodiment at least about 6 carbon atoms, and in one embodiment no more than about 18 carbon atoms, in another embodiment no more than about 12 carbon atoms, and in yet another embodiment no more than about 10 carbon atoms, although the number of carbon atoms can be outside of these ranges.

The arylalkyl group for $R_1$ and $R_1'$ may include substituted and unsubstituted arylalkyl groups, and wherein hetero atoms, such as oxygen, nitrogen, sulfur, silicon, phosphorus, boron, and the like may be present in either the aryl or the alkyl portion of the arylalkyl group. The arylalkyl group for $R_1$ and $R_1'$ may include at least about 6 carbon atoms, and in another embodiment at least about 7 carbon atoms, and in one embodiment no more than about 100 carbon atoms, in another embodiment no more than about 60 carbon atoms, and in yet another embodiment no more than about 30 carbon atoms, although the number of carbon atoms can be outside of these ranges.

The alkylaryl group for $R_1$ and $R_1'$ of the ester-terminated oligo-amide may include substituted and unsubstituted alkylaryl groups, and wherein hetero atoms, such as oxygen, nitrogen, sulfur, silicon, phosphorus, boron, and the like, may be present in either the aryl or the alkyl portion of the alkylaryl group. The alkylaryl group for $R_1$ and $R_1'$ may include in one embodiment at least about 6 carbon atoms, and in another embodiment at least about 7 carbon atoms, and in one embodiment no more than about 100 carbon atoms, in another embodiment no more than about 60 carbon atoms, and in yet another embodiment no more than about 30 carbon atoms, although the number of carbon atoms can be outside of these ranges.

The $R_2$ and $R_2'$ of the ester-terminated oligo-amide is, independently of the other, an alkylene group (including linear, branched, saturated, unsaturated, cyclic, substituted, and unsubstituted alkylene groups, and wherein hetero atoms, such as oxygen, nitrogen, sulfur, silicon, phosphorus, boron, and the like either may or may not be present in the alkylene group), in one embodiment with at least about 2 carbon atoms, in another embodiment with at least about 4 carbon atoms, in yet another embodiment with at least about 6 carbon atoms, in still another embodiment with at least about 8 carbon atoms, in another embodiment with at least about 10 carbon atoms, in yet another embodiment with at least about 12 carbon atoms, in still another embodiment with at least about 14 carbon atoms, in another embodiment with at least about 16 carbon atoms, in yet another embodiment with at least about 18 carbon atoms, in still another embodiment with about 20 carbon atoms, in another embodiment with at least about 22 carbon atoms, in yet another embodiment with at least about 24 carbon atoms, in still another embodiment with about 26 carbon atoms, in another embodiment with at least about 28 carbon atoms, in yet another embodiment with at least about 30 carbon atoms, in still another embodiment with about 32 carbon atoms, in another embodiment with at least about 34 carbon atoms, and in yet another embodiment with at least about 36 carbon atoms, and in one embodiment with no more than about 100 carbon atoms, in another embodiment with no more than about 80 carbon atoms, and in yet another embodiment with no more than about 60 carbon atoms, and in yet another embodiment with no more than about 50 carbon atoms although the number of carbon atoms can be outside of these ranges, including (1) linear saturated unsubstituted aliphatic groups containing no hetero atoms, (2) branched saturated unsubstituted aliphatic groups containing no hetero atoms, (3) cyclic saturated unsubstituted aliphatic groups containing no hetero atoms, (4) aliphatic groups containing both cyclic and acyclic portions, said aliphatic groups being saturated, unsubstituted, and containing no hetero atoms, (5) linear ethylenically unsaturated unsubstituted aliphatic groups containing no hetero atoms, (6) branched ethylenically unsaturated unsubstituted aliphatic groups containing no hetero atoms, (7) cyclic ethylenically unsaturated unsubstituted aliphatic groups containing no hetero atoms, (8) aliphatic groups containing both cyclic and acyclic portions, said aliphatic groups being ethylenically unsaturated, unsubstituted, and containing no hetero atoms, (9) linear saturated substituted aliphatic groups containing no hetero atoms, (10) branched saturated substituted aliphatic groups containing no hetero atoms, (11) cyclic saturated substituted aliphatic groups containing no hetero atoms, (12) aliphatic groups containing both cyclic and acyclic portions, said aliphatic groups being saturated, substituted, and containing no hetero atoms, (13) linear ethylenically unsaturated substituted aliphatic groups containing no hetero atoms, (14) branched ethylenically unsaturated substituted aliphatic groups containing no hetero atoms,
(15) cyclic ethylenically unsaturated substituted aliphatic groups containing no hetero atoms, (16) aliphatic groups containing both cyclic and acyclic portions, said aliphatic groups being ethylenically unsaturated, substituted, and contain no hetero atoms, (17) linear saturated unsubstituted aliphatic groups containing hetero atoms, (18) branched saturated unsubstituted aliphatic groups containing hetero atoms, (19) cyclic saturated unsubstituted aliphatic groups containing hetero atoms, (20) aliphatic groups containing both cyclic and acyclic portions, said aliphatic groups being saturated, unsubstituted, and containing hetero atoms, (21) linear ethylenically unsaturated unsubstituted aliphatic groups containing hetero atoms, (22) branched ethylenically unsaturated unsubstituted aliphatic groups containing hetero atoms, (23) cyclic ethylenically unsaturated unsubstituted aliphatic groups containing hetero atoms, (24) aliphatic groups containing both cyclic and acyclic portions, said aliphatic groups being ethylenically unsaturated, unsubstituted, and containing hetero atoms, (25) linear saturated substituted aliphatic groups containing hetero atoms, (26) branched saturated substituted aliphatic groups containing hetero atoms, (27) cyclic saturated substituted aliphatic groups containing hetero atoms, (28) aliphatic groups containing both cyclic and acyclic portions, said aliphatic groups being saturated, substituted, and containing hetero atoms, (29) linear ethylenically unsaturated substituted aliphatic groups containing hetero atoms, (30) branched ethylenically unsaturated substituted aliphatic groups containing hetero atoms, (31) cyclic ethylenically unsaturated substituted aliphatic groups containing hetero atoms, and (32) aliphatic groups containing both cyclic and acyclic portions, said aliphatic groups being ethylenically unsaturated, substituted, and containing hetero atoms.

The $R_2$ and $R_2'$ of the ester-terminated oligoamide is an arylene group (including substituted and unsubstituted arylene groups, and wherein hetero atoms, such as oxygen, nitrogen, sulfur, silicon, phosphorus, boron, and the like either may or may not be present in the arylene group), in one embodiment with at least about 6 carbon atoms, and in another embodiment with at least about 7 carbon atoms, and in one embodiment with no more than about 100 carbon atoms, in another embodiment with no more than about 60 carbon atoms, and in yet another embodiment with no more than about 30 carbon atoms, although the number of carbon atoms can be outside of these ranges.

The $R_2$ and $R_2'$ of the ester-terminated oligoamide is an arylalkylene group (including substituted and unsubstituted arylalkylene groups, and wherein hetero atoms, such as oxygen, nitrogen, sulfur, silicon, phosphorus, boron, and the like either may or may not be present in either the aryl or the alkyl portion of the arylalkylene group), in one embodiment with at least about 6 carbon atoms, and in another embodiment with at least about 7 carbon atoms, and in one embodiment with no more than about 100 carbon atoms, in another embodiment with no more than about 80 carbon atoms, and in yet another embodiment with no more than about 50 carbon atoms, although the number of carbon atoms can be outside of these ranges, including (a) arylalkylene groups wherein both the aryl and the alkyl portions form the linkage between the two CO groups, such as

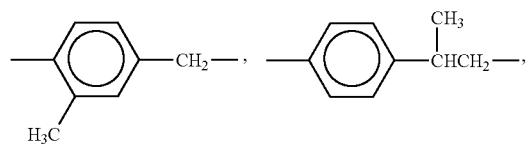

and the like, and (b) arylalkylene groups wherein only the alkyl portion forms the linkage between the two CO groups, such as

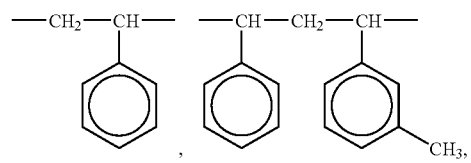

and the like.

The $R_2$ and $R_2'$ of the ester-terminated oligoamide is an alkylarylene group (including substituted and unsubstituted alkylarylene groups, and wherein hetero atoms, such as oxygen, nitrogen, sulfur, silicon, phosphorus, boron, and the like either may or may not be present in either the aryl or the alkyl portion of the alkylarylene group), in one embodiment with at least about 7 carbon atoms, and in another embodiment with at least about 14 carbon atoms, and in one embodiment with no more than about 100 carbon atoms, in another embodiment with no more than about 80 carbon atoms, and in yet another embodiment with no more than about 50 carbon atoms, although the number of carbon atoms can be outside of these ranges, such as tolylene or the like, including (a) alkylarylene groups wherein both the alkyl and the aryl portions form the linkage between the two CO groups, such as

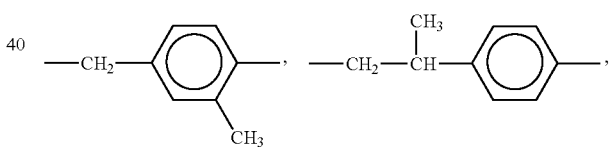

and the like, and (b) alkylarylene groups wherein only the aryl portion forms the linkage between the two CO groups, such as

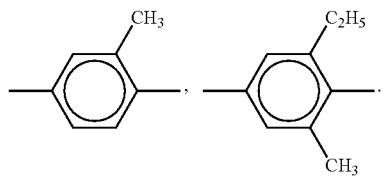

The $R_3$ of the ester-terminated oligo-amide is (i) an alkylene group (including linear, branched, saturated, unsaturated, cyclic, substituted, and unsubstituted alkylene groups, and wherein hetero atoms, such as oxygen, nitrogen, sulfur, silicon, phosphorus, boron, and the like either may or may not be present in the alkylene group), in one embodiment with at least about 2 carbon atoms, and in one embodiment with no more than about 80 carbon atoms, in another embodiment with no more than about 60 carbon atoms, in yet another embodiment with no more than about 50 carbon atoms, and in still another embodiment with no more than about 36 carbon atoms, although the number of carbons atoms can be outside of these ranges (ii) an arylene group (including substituted and unsubstituted arylene groups, and wherein hetero atoms, such as oxygen, nitrogen, sulfur, silicon, phosphorus, boron, and the like either may or may not be present in the arylene group), in one embodiment with at least about 6 carbon atoms, and in another embodiment with at least about 6 carbon atoms, and in one embodiment with no more than about 50 carbon atoms, in another embodiment with no more than about 25 carbon atoms, and in yet another embodiment with no more than about 18 carbon atoms, although the number of carbon atoms can be outside of these ranges, (iii) an arylalkylene group (including substituted and unsubstituted arylalkylene groups, and wherein hetero atoms, such as oxygen, nitrogen, sulfur, silicon, phosphorus, boron, and the like either may or may not be present in either the aryl or the alkyl portion of the arylalkylene group), in one embodiment with at least about 7 carbon atoms, and in another embodiment with no more than about 80 carbon atoms, in another embodiment with no more than about 60 carbon atoms, in yet another embodiment with no more than about 50 carbon atoms, and in still another embodiment with no more than abiur 36 carbon atoms, although the number of carbon atoms can be outside these ranges, (iv) an alkylarylene group (including substituted and unsubstituted alkylarylene groups, and wherein hetero atoms, such as oxygen, nitrogen, sulfur, silicon, phosphorus, boron, and the like either may or may not be present in either the aryl or the alkyl portion of the alkylarylene group), in one embodiment with at least about 7 carbon atoms, and in one embodiment with no more than about 80 carbon atoms, in another embodiment with no more than about 60 carbon atoms, in yet another embodiment with no more than about 50 carbon atoms, and in still another embodiment with no more than about 36 carbon atoms, although the number of carbon atoms can be outside these ranges.

The $R_4$ and $R_5$ is each, independently of the other, (i) a hydrogen atom, (ii) an alkyl group (including linear, branched, saturated, unsaturated, substituted, and unsubstituted alkyl groups), in one embodiment with at least 1 carbon atom, and in one embodiment with no more than about 3 carbon atoms, although the number of carbon atoms can be outside of these ranges.

The substituents on the substituted alkyl, alkylene, aryl, arylene, arylalkyl, arylalkylene, alkylaryl, and alkylarylene groups in $R_1$, $R_1'$, $R_2$, $R_2'$, $R_3$, $R_4$, and $R_5$ may be halogen atoms, including fluorine, chlorine, bromine, and iodine atoms, imine groups, ammonium groups, cyano groups, pyridinium groups, ether groups, aldehyde groups, ketone groups, ester groups, carbonyl groups, thiocarbonyl groups, sulfide groups, sulfoxide groups, phosphine groups, nitrile groups, mercapto groups, nitro groups, nitroso groups, sulfone groups, acyl groups, urethane groups, urea groups, mixtures thereof, and the like, wherein two or more substituents can be joined together to form a ring.

In one specific embodiment, the ester-terminated polyamide compound has a melting point of at least about 50° C., although the melting point can be outside of this range. In one specific embodiment, the ester-amide compound has a melting point of no more than about 160° C., although the melting point can be outside of this range. In one specific embodiment, the ester-amide compound has a viscosity at about 140° C. of at least about 20 cP, although the viscosity can be outside of this range. In one specific embodiment, the ester-amide compound has a viscosity at about 140° C. of no more than about 400 cP, although the viscosity can be outside of this range.

In another embodiment, the gellant is a urea gellant, such as those described in U.S. Patent Application Pub. No. 2007/0120919, which is incorporated by reference in its entirety.

In one specific embodiment the urea gellant is a dialkyl urea material. Specific examples of suitable urea gellants include those of the formula:

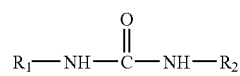

wherein $R_1$ and $R_2$ is each, independently of the other, (i) an alkyl group, including linear, branched, saturated, unsaturated, cyclic, substituted, and unsubstituted alkyl groups, and wherein hetero atoms, such as oxygen, nitrogen, sulfur, silicon, phosphorus, boron, and the like either may or may not be present in the alkyl group, in one embodiment with at least 1 carbon atom, in another embodiment with at least about 4 carbon atoms, and in yet another embodiment with at least about 10 carbon atoms, and in one embodiment equal to or less than about 100 carbon atoms, in another embodiment equal to or less than about 60 carbon atoms, and in yet another embodiment equal to or less than about 30 carbon atoms, although the number of carbon atoms can be outside of these ranges, and in yet a further embodiment including (1) linear saturated unsubstituted aliphatic groups containing no hetero atoms, (2) branched saturated unsubstituted aliphatic groups containing no hetero atoms, (3) cyclic saturated unsubstituted aliphatic groups containing no hetero atoms, (4) aliphatic groups containing both cyclic and acyclic portions, said aliphatic groups being saturated, unsubstituted, and containing no hetero atoms, (5) linear ethylenically unsaturated unsubstituted aliphatic groups containing no hetero atoms, (6) branched ethylenically unsaturated unsubstituted aliphatic groups containing no hetero atoms, (7) cyclic ethylenically unsaturated unsubstituted aliphatic groups containing no hetero atoms, (8) aliphatic groups containing both cyclic and acyclic portions, said aliphatic groups being ethylenically unsaturated, unsubstituted, and containing no hetero atoms, (9) linear saturated substituted aliphatic groups containing no hetero atoms, (10) branched saturated substituted aliphatic groups containing no hetero atoms, (11) cyclic saturated substituted aliphatic groups containing no hetero atoms, (12) aliphatic groups containing both cyclic and acyclic portions, said aliphatic groups being saturated, substituted, and containing no hetero atoms, (13) linear ethylenically unsaturated substituted aliphatic groups containing no hetero atoms, (14) branched ethylenically unsaturated substituted aliphatic groups containing no hetero atoms,

(15) cyclic ethylenically unsaturated substituted aliphatic groups containing no hetero atoms, (16) aliphatic groups containing both cyclic and acyclic portions, said aliphatic groups being ethylenically unsaturated, substituted, and contain no hetero atoms, (17) linear saturated unsubstituted aliphatic groups containing hetero atoms, (18) branched saturated unsubstituted aliphatic groups containing hetero atoms, (19) cyclic saturated unsubstituted aliphatic groups containing hetero atoms, (20) aliphatic groups containing both cyclic and acyclic portions, said aliphatic groups being saturated, unsubstituted, and containing hetero atoms, (21) linear ethylenically unsaturated unsubstituted aliphatic groups containing hetero atoms, (22) branched ethylenically unsaturated unsubstituted aliphatic groups containing hetero atoms, (23) cyclic ethylenically unsaturated unsubstituted aliphatic groups containing hetero atoms, (24) aliphatic groups containing both cyclic and acyclic portions, said aliphatic groups being ethylenically unsaturated, unsubstituted, and containing hetero atoms, (25) linear saturated substituted aliphatic groups containing hetero atoms, (26) branched saturated substituted aliphatic groups containing hetero atoms, (27) cyclic saturated substituted aliphatic groups containing hetero atoms, (28) aliphatic groups containing both cyclic and acyclic portions, said aliphatic groups being saturated, substituted, and containing hetero atoms, (29) linear ethylenically unsaturated substituted aliphatic groups containing hetero atoms, (30) branched ethylenically unsaturated substituted aliphatic groups containing hetero atoms, (31) cyclic ethylenically unsaturated substituted aliphatic groups containing hetero atoms, and (32) aliphatic groups containing both cyclic and acyclic portions, said aliphatic groups being ethylenically unsaturated, substituted, and containing hetero atoms, (ii) an aryl group (including substituted and unsubstituted aryl groups, and wherein hetero atoms, such as oxygen, nitrogen, sulfur, silicon, phosphorus, boron, and the like either may or may not be present in the aryl group), in one embodiment with at least about 5 carbon atoms, and in another embodiment with at least about 6 carbon atoms, and in one embodiment with no more than about 18 carbon atoms, in another embodiment with no more than about 12 carbon atoms, and in yet another embodiment with no more than about 6 carbon atoms, although the number of carbon atoms can be outside of these ranges, (iii) an arylalkyl group (including substituted and unsubstituted arylalkyl groups, and wherein hetero atoms, such as oxygen, nitrogen, sulfur, silicon, phosphorus, boron, and the like either may or may not be present in either the aryl or the alkyl portion of the arylalkyl group), in one embodiment with at least about 6 carbon atoms, and in another embodiment with at least about 7 carbon atoms, and in one embodiment with no more than about 100 carbon atoms, in another embodiment with no more than about 60 carbon atoms, and in yet another embodiment with no more than about 30 carbon atoms, although the number of carbon atoms can be outside of these ranges, such as benzyl or the like, or (iv) an alkylaryl group (including substituted and unsubstituted alkylaryl groups, and wherein hetero atoms, such as oxygen, nitrogen, sulfur, silicon, phosphorus, boron, and the like either may or may not be present in either the aryl or the alkyl portion of the alkylaryl group), in one embodiment with at least about 6 carbon atoms, and in another embodiment with at least about 7 carbon atoms, and in one embodiment with no more than about 100 carbon atoms, in another embodiment with no more than about 60 carbon atoms, and in yet another embodiment with no more than about 30 carbon atoms, although the number of carbon atoms can be outside of these ranges.

In one specific embodiment, urea gellant has a melting point of at least about 60° C., although the melting point can be outside of this range. In one specific embodiment, the urea gellant may have a melting point of no more than about 160° C., although the melting point can be outside of this range. In one specific embodiment, the urea gellant has a viscosity at about 120° C. of at least about 15 centipoise, although the viscosity can be outside of this range. In one specific embodiment, the urea gellant has a viscosity at about 120° C. of no more than about 200 centipoise, although the viscosity can be outside of this range.

The urea gellant may be present in the composition of at least about 0.5% by weight, in another embodiment at least about 3% by weight, and in yet another embodiment at least about 6% by weight, and in one embodiment no more than about 30% by weight, in another embodiment no more than about 20% by weight, and in yet another embodiment no more than about 15% by weight, although the amount can be outside of these ranges.

The gellant may also be a compound of the formula

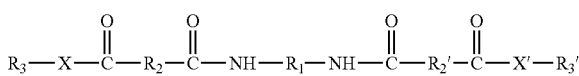

wherein: $R_1$ is selected from the group consisting of an alkylene group, an arylene group, an arylalkylene group and an alkylarylene group; $R_2$ and $R_2'$ are selected from the group consisting of an alkylene group, an arylene group, an arylalkylene group and an alkylarylene group; $R_3$ and $R_3'$ are selected from the group consisting of a photoinitiating group, an alkyl group, an aryl group, an arylalkyl group and an alkylaryl group; and X and X' is an oxygen atom or a group of the formula —$NR_4$—.

The alkylene group for $R_1$ is defined as a divalent aliphatic group or alkyl group, including linear and branched, saturated and unsaturated, cyclic and acyclic, and substituted and unsubstituted alkylene groups, and wherein heteroatoms, such as oxygen, nitrogen, sulfur, silicon, phosphorus, boron, and the like either may be present in the alkylene group). The alkylene group for $R_1$ includes from 1 carbon atom to about 12 carbon atoms. In another embodiment, the alkylene group for $R_1$ includes no more than about 4 carbon atoms, and in yet another embodiment no more than about 2 carbon atoms.

The arylene group for $R_1$ is defined as a divalent aromatic group or aryl group, including substituted and unsubstituted arylene groups, and wherein heteroatoms, such as oxygen, nitrogen, sulfur, silicon, phosphorus, boron, and the like either may be present in the arylene group. The arylene group for $R_1$ includes from about 5 carbon atoms to about 14 carbon atoms. In another embodiment, the arylene group for $R_1$ includes no more than about 10 carbon atoms, and in yet another embodiment with no more than about 6 carbon atoms.

The arylalkylene group for $R_1$ is defined as a divalent arylalkyl group, including substituted and unsubstituted arylalkylene groups, wherein the alkyl portion of the arylalkylene group can be linear or branched, saturated or unsaturated, and cyclic or acyclic, and wherein heteroatoms, such as oxygen, nitrogen, sulfur, silicon, phosphorus, boron, and the like either may be present in either the aryl or the alkyl portion of the arylalkylene group. The arylalkylene group for $R_1$ includes at least from about 6 carbon atoms, and in another embodiment with at least about 7 carbon atoms. In one embodiment, the arylalkylene group for $R_1$ includes no more than about 32 carbon atoms, in another embodiment with no more than about 22 carbon atoms, and in yet another embodiment with no more than about 7 carbon atoms.

The alkylarylene group for $R_1$ is defined as a divalent alkylaryl group, including substituted and unsubstituted alkylarylene groups, wherein the alkyl portion of the alkylarylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylarylene group. The alkylarylene group for $R_1$ includes at least about 6 carbon atoms, and in another embodiment with at least about 7 carbon atoms. In one embodiment, the alkylarylene group for $R_1$ includes no more than about 32 carbon atoms, in another embodiment with no more than about 22 carbon atoms, and in yet another embodiment with no more than about 7 carbon atom. Furthermore, the substituents on the substituted alkylene, arylene, arylalkylene, and alkylarylene groups can be halogen atoms, cyano groups, pyridine groups, pyridinium groups, ether groups, aldehyde groups, ketone groups, ester groups, amide groups, carbonyl groups, thiocarbonyl groups, sulfide groups, nitro groups, nitroso groups, acyl groups, azo groups, urethane groups, urea groups, mixtures thereof, and the like, wherein two or more substituents can be joined together to form a ring.

The alkylene group for $R_2$ and $R_2'$ may include a divalent aliphatic group or alkyl group, including linear and branched, saturated and unsaturated, cyclic and acyclic, and substituted and unsubstituted alkylene groups, and wherein heteroatoms, such as oxygen, nitrogen, sulfur, silicon, phosphorus, boron, and the like either may or may not be present in the alkylene group. The alkylene group for $R_2$ and $R_2'$ includes at least 1 carbon atom, and in one embodiment with no more than about 54 carbon atoms, and in another embodiment with no more than about 36 carbon atoms.

The arylene group for $R_2$ and $R_2'$ may include a divalent aromatic group or aryl group, including substituted and unsubstituted arylene groups, and wherein heteroatoms, such as oxygen, nitrogen, sulfur, silicon, phosphorus, boron, and the like either may or may not be present in the arylene group. The arylene group for $R_2$ and $R_2'$ includes at least about 5 carbon atoms, and in one embodiment with no more than about 14 carbon atoms, in another embodiment with no more than about 10 carbon atoms, and in yet another embodiment with no more than about 7 carbon atoms.

The arylalkylene group for $R_2$ and $R_2'$ may include a divalent arylalkyl group, including substituted and unsubstituted arylalkylene groups, wherein the alkyl portion of the arylalkylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the arylalkylene group. The arylalkylene group for $R_2$ and $R_2'$ includes at least about 6 carbon atoms, and in one embodiment with no more than about 32 carbon atoms, in another embodiment with no more than about 22 carbon atoms, and in yet another embodiment with no more than about 8 carbon atoms.

The alkylarylene group for $R_2$ and $R_2'$ may include a divalent alkylaryl group, including substituted and unsubstituted alkylarylene groups, wherein the alkyl portion of the alkylarylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylarylene group. The alkylarylene group for $R_2$ and $R_2'$ includes at least about 6 carbon atoms, and in one embodiment with no more than about 32 carbon atoms, in another embodiment with no more than about 22 carbon atoms, and in yet another embodiment with no more than about 7 carbon atoms, although the number of carbon atoms can be outside of these ranges. The substituents for the alkylene, arylene, arylalkylene, and alkylarylene groups can be (but are not limited to) halogen atoms, cyano groups, ether groups, aldehyde groups, ketone groups, ester groups, amide groups, carbonyl groups, thiocarbonyl groups, phosphine groups, phosphonium groups, phosphate groups, nitrile groups, mercapto groups, nitro groups, nitroso groups, acyl groups, acid anhydride groups, azide groups, azo groups, cyanato groups, urethane groups, urea groups, mixtures thereof, and the like, wherein two or more substituents can be joined together to form a ring.

The alkylarylene group for $R_2$ may be derived from 1-(4-(2-hydroxyethoxy)phenyl)-2-hydroxy-2-methylpropan-1-one, 1-hydroxycyclohexylphenylketone, 2-hydroxy-2-methyl-1-phenylpropan-1-one, and the like. The formulas for these compounds are described in paragraph [0073] of U.S. Patent Application Pub. No. 2008/0218570, the disclosure of which is incorporated herein by reference herein in its entirety.

The alkyl group for $R_3$ and $R_3'$ may include linear and branched, saturated and unsaturated, cyclic and acyclic, and substituted and unsubstituted alkyl groups, and wherein heteroatoms, such as oxygen, nitrogen, sulfur, silicon, phosphorus, boron, and the like either may be present in the alkyl group. The alkyl group for $R_3$ and $R_3'$ includes at least about 2 carbon atoms, in another embodiment with at least about 3 carbon atoms, and in yet another embodiment with at least about 4 carbon atoms, and in one embodiment with no more than about 100 carbon atoms, in another embodiment with no more than about 60 carbon atoms, and in yet another embodiment with no more than about 30 carbon atoms.

The alkyl group for $R_3$ and $R_3'$ may include substituted and unsubstituted aryl groups, and wherein heteroatoms, such as oxygen, nitrogen, sulfur, silicon, phosphorus, boron, and the like either may be present in the aryl group. The aryl group for $R_3$ includes at least about 5 carbon atoms, and in another embodiment with at least about 6 carbon atoms, and in one embodiment with no more than about 100 carbon atoms, in another embodiment with no more than about 60 carbon atoms, and in yet another embodiment with no more than about 30 carbon atoms.

The arylalkyl group for $R_3$ and $R_3'$ may include a substituted and unsubstituted arylalkyl groups, wherein the alkyl portion of the arylalkyl group can be linear or branched, saturated or unsaturated, and cyclic or acyclic, and wherein heteroatoms, such as oxygen, nitrogen, sulfur, silicon, phosphorus, boron, and the like either may be present in either the aryl or the alkyl portion of the arylalkyl group. The arylalkyl group for $R_3$ and $R_3'$ includes at least about 6 carbon atoms, and in another embodiment at least about 7 carbon atoms, and in one embodiment no more than about 100 carbon atoms, in another embodiment no more than about 60 carbon atoms, and in yet another embodiment no more than about 30 carbon atoms.

The alkylaryl group for $R_3$ and $R_3'$ may include substituted and unsubstituted alkylaryl groups, wherein the alkyl portion of the alkylaryl group can be linear or branched, saturated or unsaturated, and cyclic or acyclic, and wherein heteroatoms, such as oxygen, nitrogen, sulfur, silicon, phosphorus, boron, and the like either may be present in either the aryl or the alkyl portion of the alkylaryl group. The alkylaryl group for $R_3$ and $R_3'$ includes at least about 6 carbon atoms, and in another embodiment at least about 7 carbon atoms, and in one embodiment no more than about 100 carbon atoms, in another embodiment with no more than about 60 carbon atoms, and in yet another embodiment with no more than about 30 carbon atoms, although the number of carbon atoms can be outside of these ranges, such as tolyl or the like. The substituents on the substituted alkyl, arylalkyl, and alkylaryl groups can be halogen atoms, ether groups, aldehyde groups, ketone groups, ester groups, amide groups, carbonyl groups, thiocarbonyl groups, sulfate groups, sulfonate groups, sulfonic acid groups, sulfide groups, sulfoxide groups, phosphine groups, phosphonium groups, phosphate groups, nitrile groups, mercapto groups, nitro groups, nitroso groups, sulfone groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof, and the like, wherein two or more substituents can be joined together to form a ring.

The X and X' may include an oxygen atom or a group of the formula —$NR_4$—, wherein $R_4$ is: (i) a hydrogen atom; (ii) an alkyl group, including linear and branched, saturated and unsaturated, cyclic and acyclic, and substituted and unsubstituted alkyl groups, and wherein heteroatoms either may be present in the alkyl group, in one embodiment with at least 1 carbon atom, and in one embodiment with no more than about 100 carbon atoms, in another embodiment with no more than about 60 carbon atoms, and in yet another embodiment with no more than about 30 carbon atoms, (iii) an aryl group, including substituted and unsubstituted aryl groups, and wherein heteroatoms either may be present in the aryl group, in one embodiment with at least about 5 carbon atoms, and in another embodiment with at least about 6 carbon atoms, and in one embodiment with no more than about 100 carbon atoms, in another embodiment with no more than about 60 carbon atoms, and in yet another embodiment with no more than about 30 carbon atoms, (iv) an arylalkyl group, including substituted and unsubstituted arylalkyl groups, wherein the alkyl portion of the arylalkyl group can be linear or branched, saturated or unsaturated, and cyclic or acyclic, and wherein heteroatoms either may be present in either the aryl or the alkyl portion of the arylalkyl group, in one embodiment with at least about 6 carbon atoms, and in another embodiment with at least about 7 carbon atoms, and in one embodiment with no more than about 100 carbon atoms, in another embodiment with no more than about 60 carbon atoms, and in yet another embodiment with no more than about 30 carbon atoms, or (v) an alkylaryl group, including substituted and unsubstituted alkylaryl groups, wherein the alkyl portion of the alkylaryl group can be linear or branched, saturated or unsaturated, and cyclic or acyclic, and wherein heteroatoms either may be present in either the aryl or the alkyl portion of the alkylaryl group, in one embodiment with at least about 6 carbon atoms, and in another embodiment with at least about 7 carbon atoms, and in one embodiment with no more than about 100 carbon atoms, in another embodiment with no more than about 60 carbon atoms, and in yet another embodiment with no more than about 30 carbon atoms, wherein the substituents on the substituted alkyl, aryl, arylalkyl, and alkylaryl groups can be (but are not limited to) halogen atoms, ether groups, aldehyde groups, ketone groups, ester groups, amide groups, carbonyl groups, thiocarbonyl groups, sulfate groups, sulfonate groups, sulfonic acid groups, sulfide groups, sulfoxide groups, phosphine groups, phosphonium groups, phosphate groups, nitrile groups, mercapto groups, nitro groups, nitroso groups, sulfone groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof, and the like, wherein two or more substituents can be joined together to form a ring In one specific embodiment, $R_2$ and $R_2'$ are each groups of the formula —$C_{34}H_{56+a}$— and are branched alkylene groups which may include unsaturations and cyclic groups, wherein a is an integer of 0, 1, 2, 3, 4, 5, 6, 7, 8, 9, 10, 11, or 12, including isomers of the formula

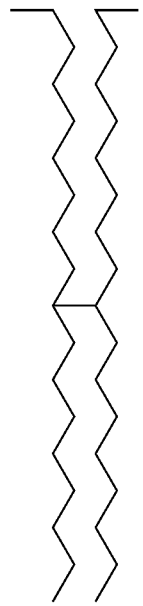

In one specific embodiment, $R_1$ is an ethylene (—$CH_2CH_2$—) group.

In one specific embodiment, $R_3$ and $R_3'$ are both

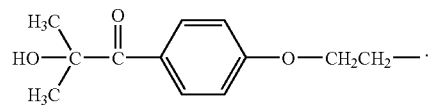

In one specific embodiment, the compound is of the formula

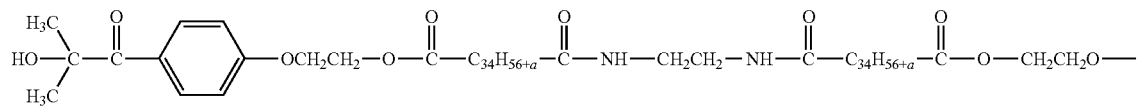

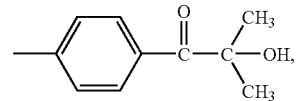

wherein —$C_{34}H_{56+a}$— represents a branched alkylene group which may include unsaturations and cyclic groups, wherein a is an integer of 0, 1, 2, 3, 4, 5, 6, 7, 8, 9, 10, 11, or 12, including isomers of the formula wherein —$C_{34}H_{56+a}$— represents a branched alkylene group which may include unsaturations and cyclic groups, wherein a is an integer of 0, 1, 2, 3, 4, 5, 6, 7, 8, 9, 10, 11, or 12 and wherein m is an integer, including embodiments wherein m is 2, including isomers of the formula

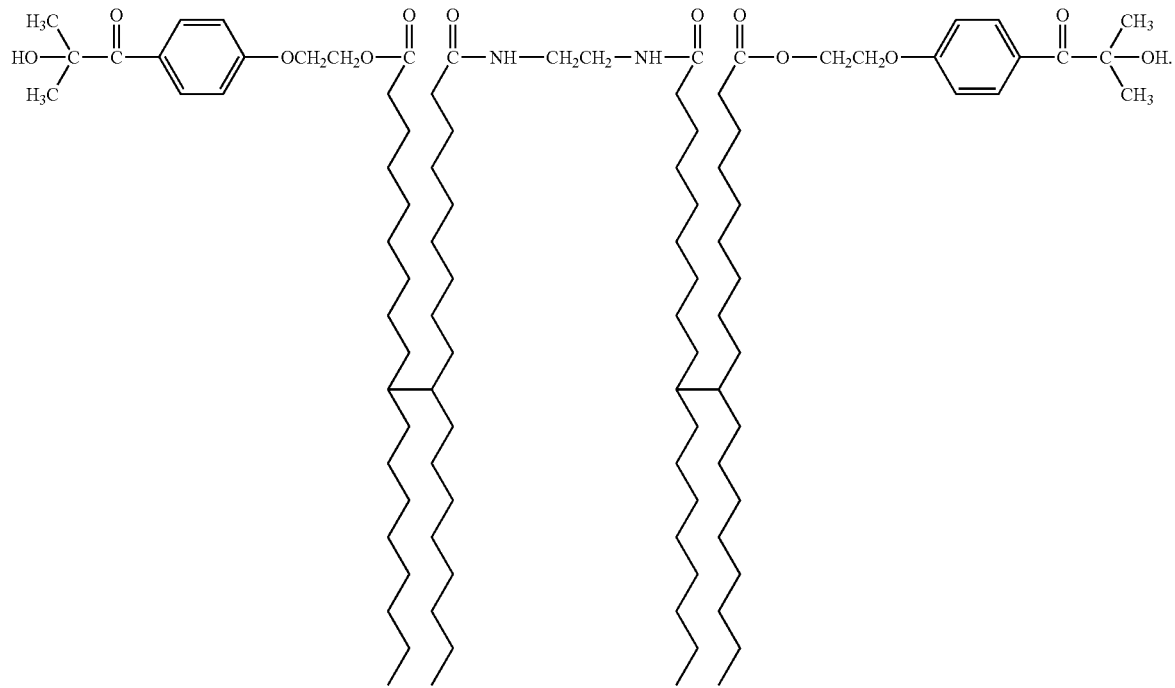 [SMILES: CCCCCCCCC(CCCCCCCCC(=O)NCCNC(=O)CCCCCCCCC(CCCCCCCC)C(CCCCCCCC)CCCCCCCCC(=O)OCCOc1ccc(C(=O)C(C)(C)O)cc1)C(CCCCCCCC)CCCCCCCCC(=O)OCCOc1ccc(C(=O)C(C)(C)O)cc1]

Additional specific examples of compounds of this formula include those of the formula

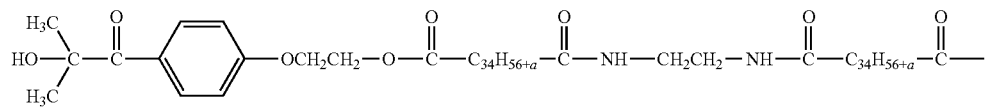

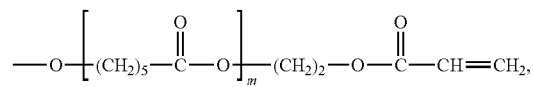

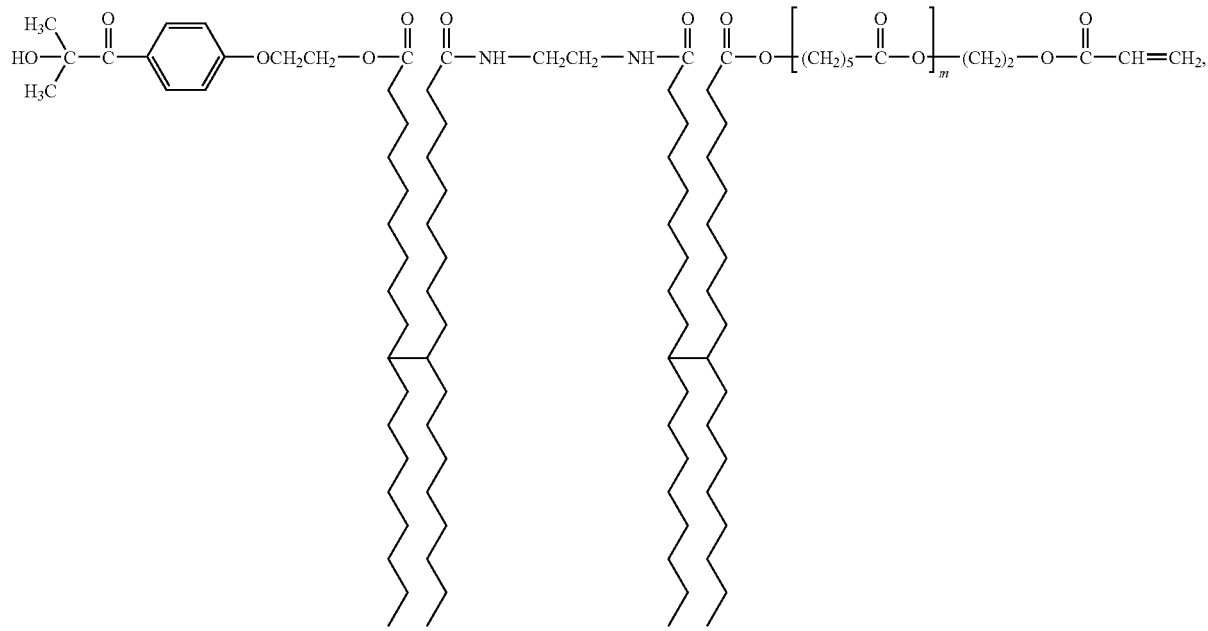
those of the formula
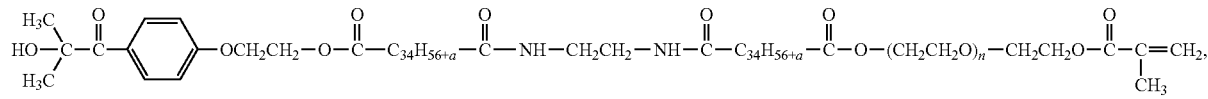
wherein —$C_{34}H_{56+a}$— represents a branched alkylene group which may include unsaturations and cyclic groups, wherein a is an integer of 0, 1, 2, 3, 4, 5, 6, 7, 8, 9, 10, 11, or 12 and wherein n is an integer, including embodiments wherein n is 2 and wherein n is 5, including isomers of the formula
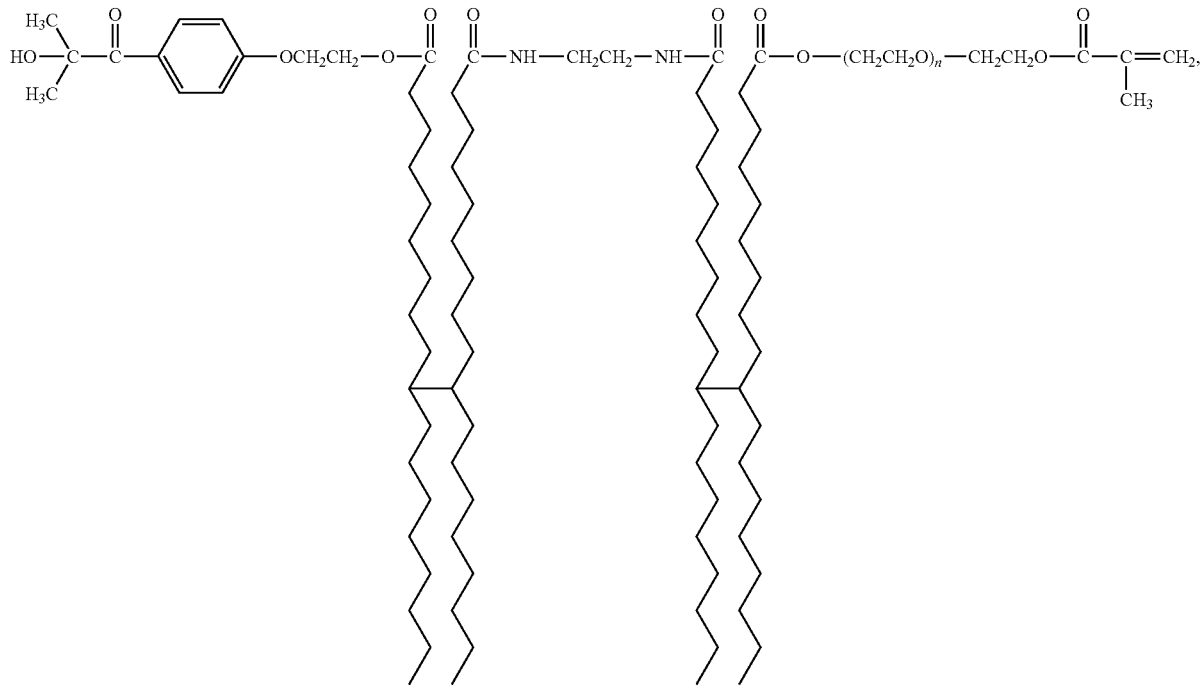

those of the formula

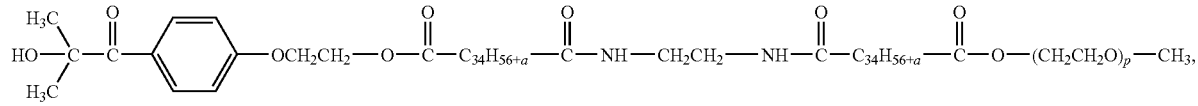

wherein —C$_{34}$H$_{56+a}$— represents a branched alkylene group which may include unsaturations and cyclic groups, wherein a is an integer of 0, 1, 2, 3, 4, 5, 6, 7, 8, 9, 10, 11, or 12 and wherein p is an integer, including embodiments wherein p is 2 and wherein p is 3, including isomers of the formula wherein —C$_{34}$H$_{56+a}$— represents a branched alkylene group which may include unsaturations and cyclic groups, wherein a is an integer of 0, 1, 2, 3, 4, 5, 6, 7, 8, 9, 10, 11, or 12 and wherein q is an integer, including embodiments wherein q is 2 and wherein q is 3, including isomers of the formula

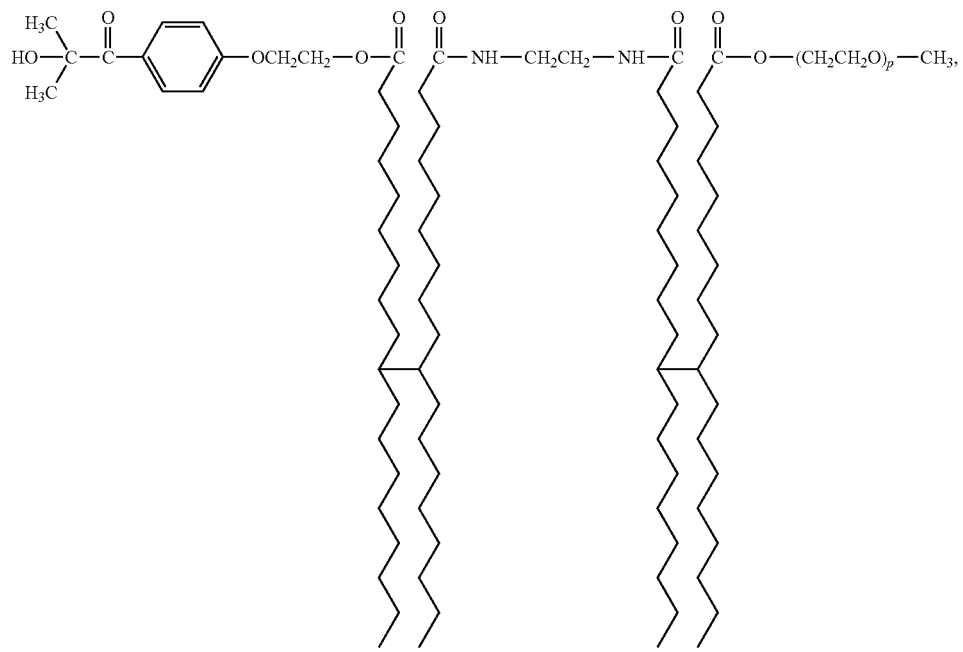

those of the formula

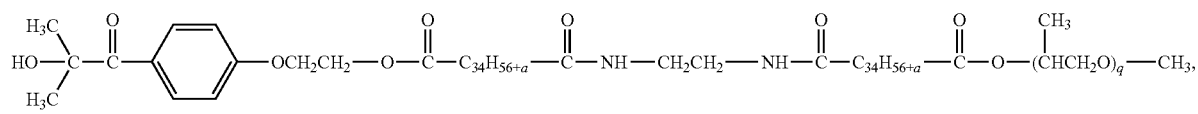

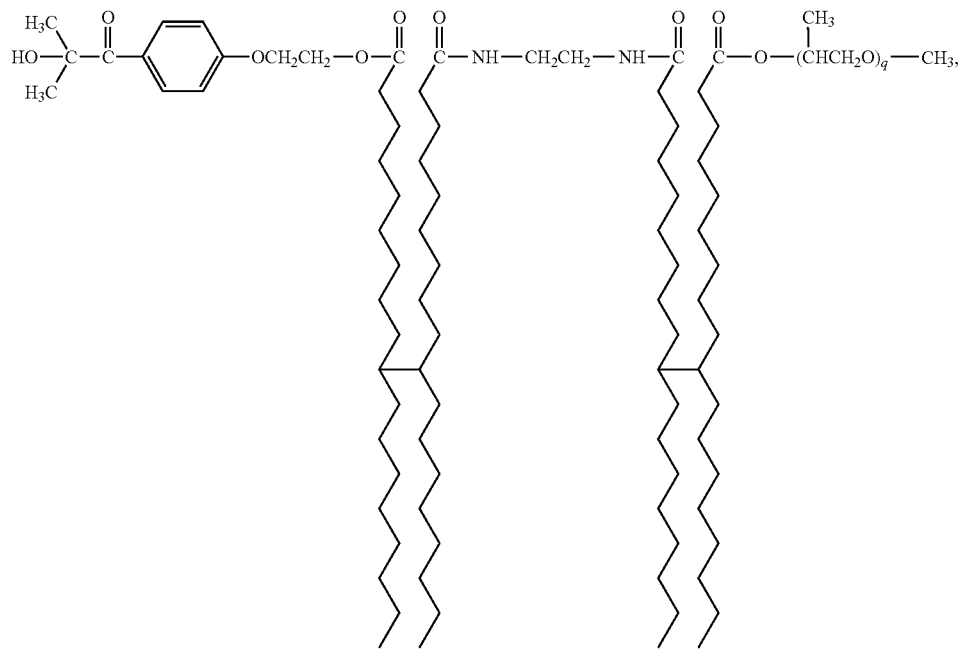
those of the formula
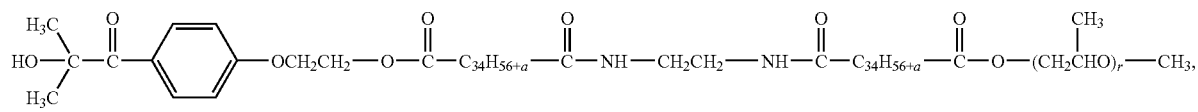
wherein —$C_{34}H_{56+a}$— represents a branched alkylene group which may include unsaturations and cyclic groups, wherein a is an integer of 0, 1, 2, 3, 4, 5, 6, 7, 8, 9, 10, 11, or 12 and wherein r is an integer, including embodiments wherein r is 2 and wherein r is 3, including isomers of the formula
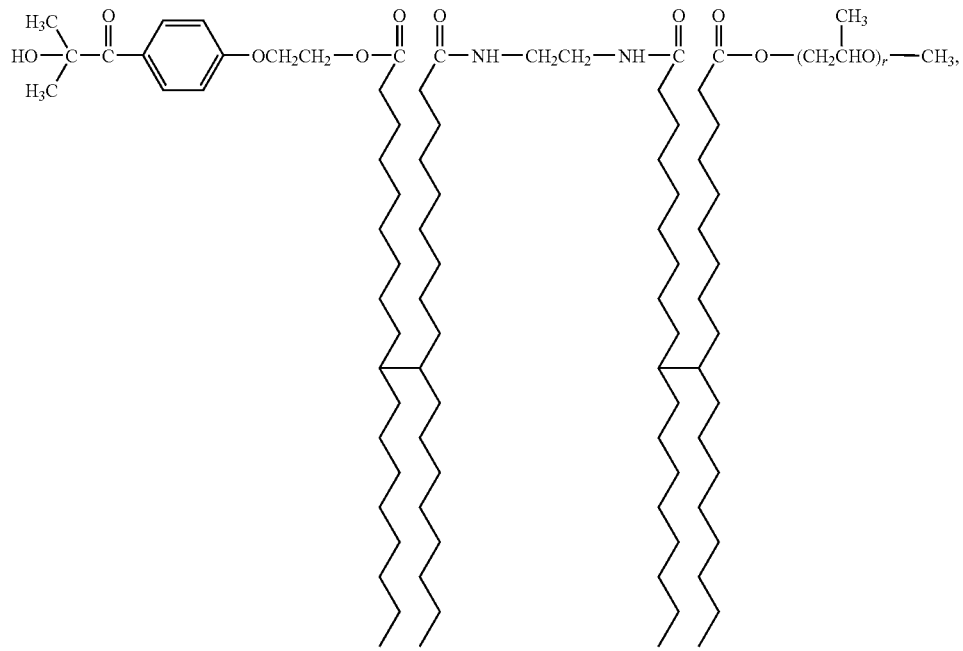
and the like, as well as mixtures thereof.

The gellant may be present in the composition in an amount of at least 0.1 weight percent of the composition, such as for example from about 0.1 weight percent to about 10 weight percent, from about 1 weight percent to about 7 weight percent, from about 1 weight percent to about 6 weight percent and from about 2 weight percent to about 5 weight percent of the composition.

A low melting wax may also be employed in the composition disclosed herein. The low melting wax can comprise a polyalkylene wax, such as a polyethylene wax, a polypropylene wax, mixtures thereof, or the like. The polyalkylene wax(es) is present in the composition in any desired or effective amount, in one embodiment of at least about 0.1% by weight of the composition, in another embodiment of at least about 5% by weight of the composition, and in yet another embodiment of at least about 1% by weight of the composition, and in one embodiment equal to or less than about 20% by weight of the composition, in another embodiment equal to or less than about 35% by weight of the composition, and in yet another embodiment equal to or less than about 25% by weight of the composition, although the amount can be outside of these ranges.

Examples of suitable polyalkylene waxes include POLYWAX 500 (commercially available from Baker Petrolite) and distilled POLYWAX 500, in one embodiment having a viscosity at a depositing temperature of about 110° C. of about 10% to about 100% higher than the viscosity of the undistilled POLYWAX 500, POLYWAX 400 commercially available from Baker Petrolite and distilled POLYWAX 400, VYBAR 103 and VYBAR 253 commercially available from Baker Petrolite, and POLYWAX 655. Higher molecular weight POLYWAX materials can also suitable. The molecular weight of the polyalkylene wax is in an embodiment of this disclosure in the range of 500 to 600 g/mole.

The low melting wax component in the composition can also comprise functional wax(es) which can also be included in the composition. In embodiments, functional alcohol waxes can be employed herein. In further embodiments, the functional alcohol wax can be a mono-functional alcohol wax, a di-functional alcohol wax, a tri-functional alcohol wax, a tetra-functional alcohol wax, or mixtures thereof. The functional alcohol wax(es) is present in the composition in any desired or effective amount, in one embodiment of at least about 0.1% by weight of the composition, in another embodiment of at least about 5% by weight of the composition, and in yet another embodiment of at least about 1% by weight of the composition, and in one embodiment of equal to or less than about 20% by weight of the composition, in another embodiment equal to or less than about 25% by weight of the composition, and in yet another embodiment equal to or less than about 35% by weight of the composition, although the amount can be outside of these ranges.

In embodiments, at least a portion of the functional waxes can be mono-functional wax which can be substituted with a di-, tri- and/or tetra-functional wax. The substitution can be done in one embodiment at a predetermined hydroxyl number for the resultant composition. The hydroxyl number (ASTM E-222-00 mod.) of the composition is in one embodiment of at least about 20, in another embodiment of at least about 25, and in yet another embodiment of at least about 35, and in one embodiment equal to or less than about 100, in another embodiment equal to or less than about 80, and in yet another embodiment equal to or less than about 50, although the hydroxyl number can be outside of these ranges. In another embodiment, the functional wax(es) can have a melting temperature of at least about 50° C., in another embodiment at least about 60° C., and in another embodiment at least about 70° C., and in one embodiment equal to or less than about 110° C., in a further embodiment equal to or less than about 105° C., and in yet another embodiment equal to or less than about 100° C., although the temperature can be outside of these ranges.

Examples of suitable functional waxes include UNILIN 350 and UNILIN 425 (commercially available from Baker Petrolite), and the distilled fractions of these functional waxes. In one embodiment, the viscosity of the distilled functional wax at the depositing temperature is from about 5 to equal to or less than about 50% higher than the non distilled functional wax(es). Other examples of functional waxes can be a 1-docosanol wax commercially available from Aldrich. Mono functional waxes which can be employed herein are the waxes of 1-tetradecanol, 1-pentadecanol, 1-hexadecanol, 1-heptadecanol, 1-octadecanol, 1-nonadecanol, 1-eicosanol, 1-tricosanol, 1-tetracosanol, 1-pentacosanol, 1-hexacosanol, 1-heptacosanol, 1-octacosanol, 1-nonacosanol, 1-tricontanol, 1-dotriacontanol, 1-tritriacontanol, 1-tetratriacontanol. Guerbet alcohols can also be suitable such as 2-tetradecyl 1-octadecanol, 2-hexadecyl 1-eicosanol, 2-octadecyl 1-docosanol, 2-nonadecyl 1-tricosanol, 2-eicosyl tetracosanol, and mixtures thereof. Di-functional waxes can include the waxes of diols such as 1,8-octanediol, 1,9-nonanediol, 1,10-decanediol, 1,12-dodecanediol, 1,13-tridecanediol, 1,14-tetradecanediol, 1,15-pentadecanediol, 1,16-hexandecanediol, 1,17-heptadecanediol, 1,18-octadecanediol, 1,19-nonadecanediol, 1,20-eicosanediol, 1,22-docosanediol, 1,25-pentacosanediol, and mixtures thereof. Other polyhydric alcohols that can be used in the composition are trimethylolpropane, pentaerythritol, neopentylglycol, mannitol, sorbitol, and mixtures thereof, including mixtures with mono- and di-functionalized alcohols above.

In one embodiment, the polyalkylene wax and functional wax can be employed in weight ratio of at least about 0.35, in another embodiment at least about 0.40 and in a further embodiment at least about 0.45, and in another embodiment equal to or less than to 0.65, in a further embodiment equal to or less than about 0.60, and in still a further embodiment equal to or less than about 0.55, although the weight ratio can be outside of these ranges.

The composition may also include the low polarity resins described in copending U.S. patent application Ser. No. 12/408,897 to Marcel Breton filed Mar. 20, 2009, which is incorporated by reference herein in its entirety.

Hindered amine antioxidant may be present in the composition described herein in any desired or effective amount, in one embodiment of at least about 0.001 percent by weight of the composition, in another embodiment of at least about 0.05 percent by weight of the composition, and in yet another embodiment of at least about 0.10 percent by weight of the composition, and in one embodiment of equal to or less than about 0.50 percent by weight of the composition, in another embodiment of equal to or less than about 0.25 percent by weight of the composition, and in yet another embodiment of equal to or less than about 0.15 percent by weight of the composition, although the amount can be outside of these ranges.

Examples of suitable hindered amine antioxidants include those of general formula

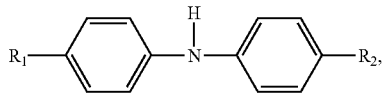

wherein $R_1$ and $R_2$ each, independently of the other, can be a hydrogen atom or an alkyl group, including linear, branched, saturated, unsaturated, cyclic, substituted, and unsubstituted alkyl groups, and wherein heteroatoms, such as oxygen, nitrogen, sulfur, silicon, phosphorus, boron, either may or may not be present in the alkyl group, in one embodiment with at least 1 carbon atom.

Specific examples of suitable hindered amine antioxidants include the following antioxidants commercially available from Crompton; NAUGUARD 445 where $R_1=R_2=C(CH_3)_2$Ph, NAUGUARD 635 where $R_1=R_2=-CH(CH_3)$Ph, NAUGUARD PS-30 where $R_1=C_4$ or $C_8$, $R_2=C_4$ or $C_8$ and the like.

A hindered phenol antioxidant can also be provided. In one embodiment, the hindered phenol is present in a relatively high concentration. A high concentration of hindered phenol antioxidant maximizes long term thermal stability by delaying the onset of the oxidation itself. The hindered phenol antioxidant is present in the composition in any desired or effective amount, in one embodiment of at least about 0.01% by weight of the composition, in another embodiment of at least about 0.5% by weight of the composition, and in yet another embodiment of at least about 1.5% by weight of the composition, and in one embodiment equal to or less than about 4.0% by weight of the composition, in another embodiment equal to or less than about 3.0% by weight of the composition, and in yet another embodiment equal to or less than about 2.5% by weight of the composition, although the amount can be outside of these ranges. Specific examples of suitable hindered phenol antioxidants include ETHANOX 330, ETHANOX 310, ETHANOX 314, ETHANOX 376 (commercially available from Albemarle) and the like. Also commercially available from Ciba Specialty Chemicals are IRGANOX 1010, IRGANOX 1035, IRGANOX 1076, IRGANOX 1330 and the like. Mixtures of two or more of these hindered phenol antioxidants can also be employed.

The composition may also contain an optional colorant. Any desired or effective colorant can be employed in the compositions, including pigment, dye, mixtures of pigment and dye, mixtures of pigments, mixtures of dyes, and the like, provided that the colorant can be dissolved or dispersed in the composition. The compositions can be used in combination with conventional ink colorant materials, such as Color Index (C.I.) Solvent Dyes, Disperse Dyes, modified Acid and Direct Dyes, Basic Dyes, Sulphur Dyes, Vat Dyes, and the like. Examples of suitable dyes include Neozapon Red 492 (BASF); Orasol Red G (Ciba); Direct Brilliant Pink B (Oriental Giant Dyes); Direct Red 3BL (Classic Dyestuffs); Supranol Brilliant Red 3BW (Bayer AG); Lemon Yellow 6G (United Chemie); Light Fast Yellow 3G (Shaanxi); Aizen Spilon Yellow C-GNH (Hodogaya Chemical); Bernachrome Yellow GD Sub (Classic Dyestuffs); Cartasol Brilliant Yellow 4GF (Clariant); Cibanon Yellow 2GN (Ciba); Orasol Black CN (Ciba); Savinyl Black RLSN (Clariant); Pyrazol Black BG (Clariant); Morfast Black 101 (Rohm & Haas); Diaazol Black RN (ICI); Orasol Blue GN (Ciba); Savinyl Blue GLS (Clariant); Luxol Fast Blue MBSN (Pylam Products); Sevron Blue 5GMF (Classic Dyestuffs); Basacid Blue 750 (BASF), Neozapon Black X51 (BASF), Classic Solvent Black 7 (Classic Dyestuffs), Sudan Blue 670 (C.I. 61554) (BASF), Sudan Yellow 146 (C.I. 12700) (BASF), Sudan Red 462 (C.I. 26050) (BASF), C.I. Disperse Yellow 238, Neptune Red Base NB543 (BASF, C.I. Solvent Red 49), Neopen Blue FF-4012 from BASF, Lampronol Black BR from ICI (C.I. Solvent Black 35), Morton Morplas Magenta 36 (C.I. Solvent Red 172), metal phthalocyanine colorants such as those disclosed in U.S. Pat. No. 6,221,137, the disclosure of which is totally incorporated herein by reference, and the like. Polymeric dyes can also be used, such as those disclosed in, for example, U.S. Pat. No. 5,621,022 and U.S. Pat. No. 5,231,135, the disclosures of each of which are herein entirely incorporated herein by reference, and commercially available from, for example, Milliken & Company as Milliken Ink Yellow 869, Milliken Ink Blue 92, Milliken Ink Red 357, Milliken Ink Yellow 1800, Milliken Ink Black 8915-67, uncut Reactant Orange X-38, uncut Reactant Blue X-17, Solvent Yellow 162, Acid Red 52, Solvent Blue 44, and uncut Reactant Violet X-80.

Pigments are also suitable colorants for the composition. Examples of suitable pigments include PALIOGEN Violet 5100 (commercially available from BASF); PALIOGEN Violet 5890 (commercially available from BASF); HELIOGEN Green L8730 (commercially available from BASF); LITHOL Scarlet D3700 (commercially available from BASF); SUNFAST Blue 15:4 (commercially available from Sun Chemical); Hostaperm Blue B2G-D (commercially available from Clariant); Hostaperm Blue B4G (commercially available from Clariant); Permanent Red P-F7RK; Hostaperm Violet BL (commercially available from Clariant); LITHOL Scarlet 4440 (commercially available from BASF); Bon Red C (commercially available from Dominion Color Company); ORACET Pink RF (commercially available from Ciba); PALIOGEN Red 3871 K (commercially available from BASF); SUNFAST Blue 15:3 (commercially available from Sun Chemical); PALIOGEN Red 3340 (commercially available from BASF); SUNFAST Carbazole Violet 23 (commercially available from Sun Chemical); LITHOL Fast Scarlet L4300 (commercially available from BASF); SUNBRITE Yellow 17 (commercially available from Sun Chemical); HELIOGEN Blue L6900, L7020 (commercially available from BASF); SUNBRITE Yellow 74 (commercially available from Sun Chemical); SPECTRA PAC C Orange 16 (commercially available from Sun Chemical); HELIOGEN Blue K6902, K6910 (commercially available from BASF); SUNFAST Magenta 122 (commercially available from Sun Chemical); HELIOGEN Blue D6840, D7080 (commercially available from BASF); Sudan Blue OS (commercially available from BASF); NEOPEN Blue FF4012 (commercially available from BASF); PV Fast Blue B2GO1 (commercially available from Clariant); IRGALITE Blue BCA (commercially available from Ciba); PALIOGEN Blue 6470 (commercially available from BASF); Sudan Orange G (commercially available from Aldrich), Sudan Orange 220 (commercially available from BASF); PALIOGEN Orange 3040 (BASF); PALIOGEN Yellow 152, 1560 (commercially available from BASF); LITHOL Fast Yellow 0991 K (commercially available from BASF); PALIOTOL Yellow 1840 (commercially available from BASF); NOVOPERM Yellow FGL (commercially available from Clariant); Ink Jet Yellow 4G VP2532 (commercially available from Clariant); Toner Yellow HG (commercially available from Clariant); Lumogen Yellow D0790 (commercially available from BASF); Suco-Yellow L1250 (commercially available from BASF); Suco-Yellow D1355 (commercially available from BASF); Suco Fast Yellow D1 355, D1 351 (commercially available from BASF);

HOSTAPERM Pink E 02 (commercially available from Clariant); Hansa Brilliant Yellow 5GX03 (commercially available from Clariant); Permanent Yellow GRL 02 (commercially available from Clariant); Permanent Rubine L6B 05 (commercially available from Clariant); FANAL Pink D4830 (commercially available from BASF); CINQUASIA Magenta (commercially available from DU PONT); PALIOGEN Black L0084 (commercially available from BASF); Pigment Black K801 (commercially available from BASF); and carbon blacks such as REGAL 330™ (commercially available from Cabot), Nipex 150 (commercially available from Degussa) Carbon Black 5250 and Carbon Black 5750 (commercially available from Columbia Chemical), and the like, as well as mixtures thereof.

Also suitable are the colorants disclosed in U.S. Pat. No. 6,472,523, U.S. Pat. No. 6,726,755, U.S. Pat. No. 6,476,219, U.S. Pat. No. 6,576,747, U.S. Pat. No. 6,713,614, U.S. Pat. No. 6,663,703, U.S. Pat. No. 6,755,902, U.S. Pat. No. 6,590,082, U.S. Pat. No. 6,696,552, U.S. Pat. No. 6,576,748, U.S. Pat. No. 6,646,111, U.S. Pat. No. 6,673,139, U.S. Pat. No. 6,958,406, U.S. Pat. No. 6,821,327, U.S. Pat. No. 7,053,227, U.S. Pat. No. 7,381,831 and U.S. Pat. No. 7,427,323, the disclosures of each of which are incorporated herein by reference in their entirety.

The composition may also contain a solvent dye. An example of a solvent dye suitable for use herein may include spirit soluble dyes because of their compatibility with the compositions disclosed herein. Examples of suitable spirit solvent dyes include Neozapon Red 492 (BASF); Orasol Red G (Ciba); Direct Brilliant Pink B (Global Colors); Aizen Spilon Red C-BH (Hodogaya Chemical); Kayanol Red 3BL (Nippon Kayaku); Spirit Fast Yellow 3G; Aizen Spilon Yellow C-GNH (Hodogaya Chemical); Cartasol Brilliant Yellow 4GF (Clariant); Pergasol Yellow CGP (Ciba); Orasol Black RLP (Ciba); Savinyl Black RLS (Clariant); Morfast Black Conc. A (Rohm and Haas); Orasol Blue GN (Ciba); Savinyl Blue GLS (Sandoz); Luxol Fast Blue MBSN (Pylam); Sevron Blue 5GMF (Classic Dyestuffs); Basacid Blue 750 (BASF), Neozapon Black X51 [C.I. Solvent Black, C.I. 12195] (BASF), Sudan Blue 670 [C.I. 61554] (BASF), Sudan Yellow 146 [C.I. 12700] (BASF), Sudan Red 462 [C.I. 260501] (BASF), mixtures thereof and the like.

The colorant may be present in the composition in any desired or effective amount to obtain the desired color or hue such as, for example, from about 0 percent by weight of the composition to about 20 percent by weight of the composition, at least from about 0.2 percent by weight of the composition to about 10 percent by weight of the composition, and at least from about 0.5 percent by weight of the composition to about 5 percent by weight of the composition.

The silver nanoparticles and the gellant may be dispersed in any suitable dispersing solvent in forming a solution that may be used to form silver features on a substrate. This weight percentage of the silver nanoparticles in the solvent needs to be at least about 20 weight percent of the total composition, such as, for example, from about 20 to about 90 weight percent, or from about 35 to about 85 weight percent of the total composition.

The dispersing solvent should facilitate the dispersion of the stabilized silver nanoparticles and the gellant. Examples of the dispersing solvent may include, an alkane or an alcohol having from about 10 to about 18 carbon atoms, from about 10 to about 14 carbon atoms, or from about 10 to 12 carbon atoms, such as, undecane, dodecane, tridecane, tetradecane, 1-undecanol, 2-undecanol, 3-undecanol, 4-undecanol, 5-undecanol, 6-undecanol, 1-dodecanol, 2-dodecanol, 3-dodecanol, 4-dodecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; isoparaffine hydrocarbons, such as, for example, isodecane, isododecane, and commercially available mixtures of isoparaffins such as ISOPAR E, ISOPAR G, ISOPAR H, ISOPAR L and ISOPAR M (all the above-mentioned manufactured by Exxon Chemical Company), SHELLSOL (made by Shell Chemical Company), SOLTROL (made by Philips Oil Co., Ltd.), BEGASOL (made by Mobil Petroleum Co., Inc.) and IP Solvent 2835 (made by Idemitsu Petrochemical Co., Ltd.); mineral oil, tetrahydrofuran; chlorobenzene; dichlorobenzene; trichlorobenzene; nitrobenzene; cyanobenzene; acetonitrile; dichloromethane; N,N-dimethylformamide (DMF); and mixtures thereof. One, two, three or more solvents may be used. In embodiments where two or more solvents are used, each solvent may be present at any suitable volume ratio or molar ratio such as for example from about 99 (first solvent):1 (second solvent) to about 1 (first solvent):99 (second solvent) or from about 80 (first solvent):20 (second solvent) to about 20 (first solvent):80 (second solvent).

The solvent may be present in the composition in an amount from in an amount of at least 10 weight percent of the composition, such as for example from about 10 weight percent to about 80 weight percent, from about 20 weight percent to about 65 weight percent, from about 35 weight percent to about 60 weight percent and from about 40 weight percent to about 55 weight percent of the composition.

The composition may further comprise a monoterpene alcohol to control the strength of composition and the temperature at which the hydrocarbon based gellants. Examples of the monoterpene alcohol may include terpineol (α-terpineol), β-terpineol, geraniol, cineol, cedral, linalool, 4-terpineol, lavandulol, citronellol, nerol, methol, borneol, and the like. The monoterpene alcohol may be present in the composition in an amount from an amount of about 1 weight percent to about 15 weight percent, from about 2 weight percent to about 12 weight percent, from about 5 weight percent to about 10 weight percent and from about 7 weight percent to about 10 weight percent of the composition.

The dispersed solution containing the stabilized silver nanoparticles and the gellant may be optionally heated to a temperature of about at least 120° C., such as, for example, from about 120° C. to about 165° C., from about 125° C. to about 155° C., and from about 130° C. to about 145° C., for about 20 minutes to about 1 hour to accelerate the dissolution of the resin(s) in the solvent.

The fabrication of an electrically conductive element from the composition can be carried out by depositing the composition on a substrate using a suitable liquid deposition technique at any suitable time prior to or subsequent to the formation of other optional layer or layers on the substrate. Thus, liquid deposition of the composition on the substrate can occur either on a substrate or on a substrate already containing layered material, for example, a semiconductor layer and/or an insulating layer. The silver nanoparticle composition may be referred to as an ink when deposited on a substrate.

The phrase "liquid deposition technique" refers to, for example, deposition of a composition using a liquid process such as liquid coating or printing, where the liquid is a composition comprising silver nanoparticles, a gellant and a solvent. The solvent is selected from the group consisting of an isoparaffinic hydrocarbon, a mineral oil and an alkane, and mixtures thereof. Examples of liquid coating processes may include, for example, spin coating, blade coating, rod coating, dip coating, and the like. Examples of printing techniques may include, for example, lithography or offset printing, gravure, flexography, screen printing, stencil printing, stamping (such as microcontact printing), omnidirectional printing, inkjet printing and the like. Liquid deposition deposits a layer of the composition having a thickness ranging from about 5 nanometers to about 5 millimeters, preferably from about 10 nanometers to about 1000 micrometers. The deposited silver nanoparticle composition at this stage may or may not exhibit appreciable electrical conductivity.

The stabilized silver nanoparticles can be spin-coated from the composition, for example, for about 10 seconds to about 1000 seconds, for about 50 seconds to about 500 seconds or from about 100 seconds to about 150 seconds, onto a substrate at a speed, for example, from about 100 revolutions per minute ("rpm") to about 5000 rpm, from about 500 rpm to about 3000 rpm and from about 500 rpm to about 2000 rpm.

The substrate upon which the silver features are printed may be any suitable substrate, including, for example, silicon, glass plate, plastic film, sheet, fabric, or paper. For structurally flexible devices, plastic substrates, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

Heating the deposited composition at a temperature of, for example, at or below about 250° C., induces the silver nanoparticles to form an electrically conductive layer, which is suitable for use as an electrically conductive element in electronic devices. The deposited composition may be heated at a temperature of, for example, from about 120° C. to about 250° C., from about 140° C. to about 250° C., from about 150° C. to about 230° C., 150° C. to about 200° C. and from about 150° C. to about 180° C. The heating temperature is one that does not cause adverse changes in the properties of previously deposited layer(s) or the substrate (whether single layer substrate or multilayer substrate). Also, the low heating temperatures described above allows the use of low cost plastic substrates, which have an annealing temperature below 150° C.

The heating can be performed for a time ranging from, for example, 1 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, the term "heating" encompasses any technique(s) that can impart sufficient energy to the heated material or substrate to (1) anneal the metal nanoparticles and/or (2) remove the optional stabilizer from the metal nanoparticles. Examples of heating techniques may include thermal heating (for example, a hot plate, an oven, and a burner), infra-red ("IR") radiation, a laser beam, microwave radiation, or UV radiation, or a combination thereof. A two-stage heating process can also be used where the temperature of the first stage heating is lower than the second stage heating and the first stage heating enables partial curing of the ink. This partial curing can be optionally done at a temperature below the gel transition of the ink described herein.

Heating produces a number of effects. Prior to heating, the layer of the deposited silver nanoparticles may be electrically insulating or with very low electrical conductivity, but heating results in an electrically conductive layer composed of annealed silver nanoparticles, which increases the conductivity. In embodiments, the annealed silver nanoparticles may be coalesced or partially coalesced silver nanoparticles. In embodiments, it may be possible that in the annealed silver nanoparticles, the silver nanoparticles achieve sufficient particle-to-particle contact to form the electrically conductive layer without coalescence.

In embodiments, after heating, the resulting electrically conductive layer has a thickness ranging, for example, from about 5 nanometers to about 5 microns and from about 10 nanometers to about 2 microns.

The conductivity of the resulting silver element produced by heating the deposited silver nanoparticle composition is, for example, more than about 10 Siemens/centimeter ("S/cm"), more than about 1000 S/cm, more than about 2,000 S/cm, more than about 5,000 S/cm, or more than about 10,000 S/cm.

The resulting elements can be used as electrodes, conductive pads, thin-film transistors, conductive lines, conductive tracks, and the like in electronic devices such as thin film transistors, organic light emitting diodes, RFID (radio frequency identification) tags, photovoltaics, printed antenna and other electronic devices which require conductive elements or components.

The embodiments disclosed herein will now be described in detail with respect to specific exemplary embodiments thereof, it being understood that these examples are intended to be illustrative only and the embodiments disclosed herein is not intended to be limited to the materials, conditions, or process parameters recited herein. All percentages and parts are by weight of the composition unless otherwise indicated. Room temperature refers to a temperature ranging for example from about 20° C. to about 25° C.

Example 1

Preparation of Silver Nanoparticles

Silver acetate (0.167 g, 1 mmol) and 1-hexadecylamine (4.83 g, 20 mmol) were first dissolved in toluene (100 mL) by heating at 60° C. until silver acetate was dissolved. To this solution was added a solution of phenylhydrazine (0.43 g, 4 mmol) in toluene (50 mL) with vigorous stirring over a period of 10 min. The resulting reaction mixture was stirred at 60° C. for 1 hr before cooling down to room temperature. Subsequently, acetone (10 mL) was added to the reaction mixture to destroy any excess phenylhydrazine. Solvent removal from the reaction mixture gave a residue which was added to stirring methanol (100 mL) to precipitate the crude silver nanoparticle product. The crude silver nanoparticle product was isolated by centrifugation, washed with acetone twice, and then air-dried.

Example 2

Preparation of Gellant Mixture A

A gellant mixture is prepared by adding 0.073 g of UNICLEAR 100 to 0.818 g of ISOPAR G (isoparaffinic hydrocarbon solvent) and 0.109 g of terpineol. The mixture is then heated to a temperature of about 100° C. and stirred for 30 min at this temperature.

Example 3

Preparation of Low Polarity Gel Composition A

A low polarity gel composition is prepared by mixing 0.5 g of the silver nanoparticles from EXAMPLE 1 with the gellant mixture of EXAMPLE 2 and stirring the mixture for 30 minutes at a temperature of about 100° C. Upon cooling, a low polarity nanosilver gel composition is obtained. It is believed that the gelled nanosilver compositions can be printed with a piezo printer at temperatures above the gel transition or by a more conventional printing process.

Example 4

Coating and Annealing of the Low Polarity Gel Composition A

The low polarity gel composition from above EXAMPLE 3 may be coated on a glass substrate at an elevated temperature such as 90° C. using a spin coater at 1000 rpm. The coated low polarity gel composition is then annealed at a temperature of about 180° C. to 230° C. for 120 minutes to form a thin-film of silver nanoparticles having conductive properties. Because of the presence of the gellant, the thin-film of silver nanoparticles will exhibit no cracking and will possess sufficient adhesion to the glass substrate.

Example 5

Preparation of Gellant Mixture B

A gellant mixture is prepared by adding 0.2 g of trans-4-t-butyl-1-phenyl-cyclohexanol to 1 g of ISOPAR G (isoparaffinic hydrocarbon solvent). The trans-4-t-butyl-1-phenyl-cyclohexanol is prepared as disclosed in Example 1 of U.S. Pat. No. 5,989,325, which is incorporated by reference herein in its entirety. The gellant mixture is then heated to a temperature of about 100° C. and stirred for 30 min at this temperature.

Example 6

Preparation of Low Polarity Gel Composition B

A low polarity gel composition is prepared by mixing 0.5 g of silver nanoparticles of above EXAMPLE 1 with the composition of above EXAMPLE 5 and stirring the mixture for 30 minutes at a temperature of about 70° C. Upon cooling, a low polarity nanosilver gel composition was obtained. It is believed that the gelled nanosilver compositions can be printed with a piezo printer at temperatures above the gel transition or by a more conventional printing process.

Example 7

Coating and Annealing of the Low Polarity Gel Composition B

The low polarity gel composition from above EXAMPLE 6 may be coated on a glass substrate at an elevated temperature of about 60° C. using a spin coater at 1000 rpm. The coated low polarity gel composition is then annealed at a temperature of about 180° C. to 230° C. for 120 minutes to form a thin-film of silver nanoparticles having conductive properties. Because of the presence of the gellant, the thin-film of silver nanoparticles will exhibit no cracking and will possess sufficient adhesion to the glass substrate.

Example 8

Synthesis of Gellant with Phenol End Groups

To a 250 mL round bottomed flask equipped with a magnetic stir bar was added 15.28 g of organoamide precursor (acid number: 97.16, $n_{acid}$=26.46 mmol). The organoamide precursor was prepared in the same manner as Example III of U.S. Pat. No. 7,279,587, which is incorporated by reference in its entirety. Next, 150 mL of dichloromethane was added, and the mixture was stirred until all of the organoamide precursor was dissolved. Next, 4,4-dimethylaminopyridine (323 mg, 0.1 mmol) and 1,3-dicyclohexylcarbodiimide (6.55 g, 31.75 mmol, 1.2 eq) was added to the resulting mixture and stirred. After 15 minutes, a cloudy suspension was formed. Phenol (2.49 g, 1.0 eq) was added to the suspension, and the reaction was allowed to stir overnight at room temperature. The next day, the reaction was filtered to remove N,N-dicyclohexylurea (byproduct) and the filtrate solvent was removed in vacuo to yield an off-white, opaque solid. The solid residue was washed with acetone, and filtered to furnish 11.3 g (17.2 mmol, 65%) of gellant product as a translucent gel.

Example 9

Preparation of Gellant Mixture C

A gel composition is prepared by adding 0.2 g of the gellant of EXAMPLE 8 to 1 g of ISOPAR G (isoparaffinic hydrocarbon solvent) and 0.12 g of terpineol available from Aldrich Chemical Company, Milwaukee, Wis., USA. The mixture is then heated to a temperature of about 110° C. and stirred for 50 min at this temperature.

Example 10

Preparation of Low Polarity Gel Composition C

A low polarity gel composition is prepared by mixing 0.5 g of silver nanoparticles of above EXAMPLE 1 with the composition of above EXAMPLE 9 and stirring the mixture for 30 minutes at a temperature of about 110° C. Upon cooling, a low polarity nanosilver gel composition is obtained. It is believed that the gelled nanosilver compositions can be printed with a piezo printer at temperatures above the gel transition or by a more conventional printing process.

Example 11

Coating and Annealing of Low Polarity Gel Composition C

The low polarity gel composition from above EXAMPLE 10 may be coated on a glass substrate at an elevated temperature such as 80° C. using a spin coater at 1000 rpm. The coated low polarity gel composition is then annealed at a temperature of about 180° C. to 230° C. for 120 minutes to form a thin-film of silver nanoparticles having conductive properties. Because of the presence of the gellant, the thin-film of silver nanoparticles will exhibit no cracking and will possess sufficient adhesion to the glass substrate.

Comparative Example 1

Coating and Annealing of a Low Polarity Silver Dispersion without a Gelling Agent A low polarity nanosilver dispersion was prepared by mixing 2.4 g of silver nanoparticles of EXAMPLE 1 with 0.6 g of ISOPAR G at room temperature for a period of 30 min. The viscosity of the resulting low polarity paste was found to be about 50 cP (as determined using a RFS-3 Rheometic Scientific rheometer with cone and plate geometry). The low polarity dispersion (containing no gellant), liquid and room temperature, was coated on a glass substrate using spin coater at 1000 rpm and then annealed for 120 min at a temperature of 150° C. to form a conductive thin-film of silver nanoparticles with a thickness of 2450 nm. The film of silver nanoparticles exhibited thin cracks were observed in the film and did not sufficiently adhere to the surface of the substrate.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A composition comprising:
   alkylamine stabilized silver nanoparticles;
   a gellant, and
   an optional wax, wherein
   the gellant and the stabilized silver nanoparticles are dispersed in a solvent selected from the group consisting of an isoparaffinic hydrocarbon, a mineral oil and an alkane, and mixtures thereof,
   the composition is such that heating the composition produces a silver element that has a conductivity of from about 10 S/cm to about 10,000 S/cm, and
   a concentration of gellant in the composition is from about 0.1 weight percent to about 10 weight percent.

2. The composition of claim 1, wherein a stabilizer or stabilizers in the alkylamine stabilized silver nanoparticles is an organoamine selected from the group consisting methylamine, ethylamine, propylamine, butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and mixtures thereof.

3. The composition of claim 1, wherein a concentration of alkylamine stabilized silver nanoparticles in the composition is from about 5 weight percent to about 80 weight percent.

4. The composition of claim 1, wherein the gellant is a compound represented by the formula

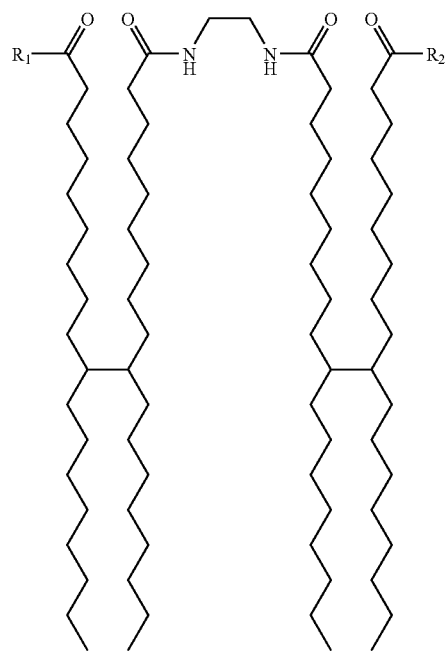

wherein $R_1$ and $R_2$ are side chains independently selected from the group consisting of a hydrogen atom, a hydrocarbon group, a heteroatom, and combinations thereof.

5. The composition of claim 4, wherein $R_1$ and $R_2$ each represent phenol.

6. The composition of claim 1, wherein the gellant is an ester terminated polyamide gellant.

7. The composition of claim 1, wherein the gellant is a compound represented by the formula

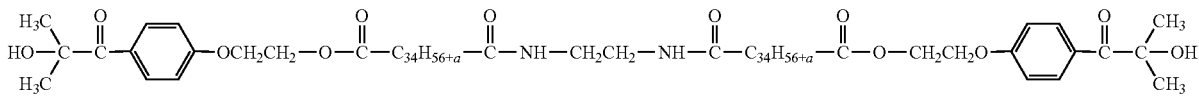

wherein $-C_{34}H_{56+a}$ each independently represents a branched alkylene group and wherein a is an integer from 0 to 12.

8. The composition of claim 1, wherein the gellant is a compound represented by the formula

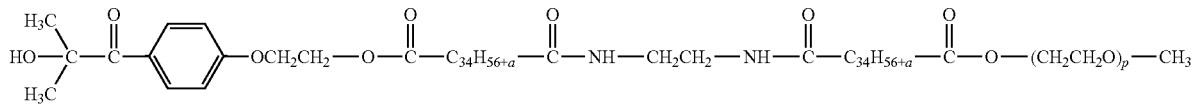

wherein —$C_{34}H_{56+a}$— each independently represents a branched alkylene group, a is an integer from 0 to 12 and p is an integer from 2 to 3.

9. The composition of claim 1, wherein the gellant is a compound represented by the formula,

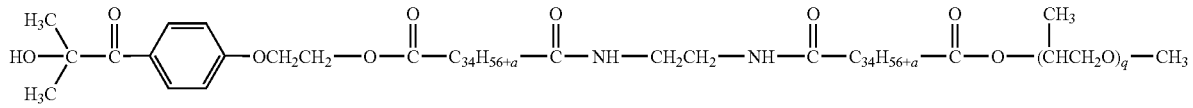

wherein —$C_{34}H_{56+a}$— each independently represents a branched alkylene group, wherein a is an integer from 0 to 12 and wherein q is an integer from 2 to 3.

10. The composition of claim 1, wherein the gellant is a compound represented by the formula,

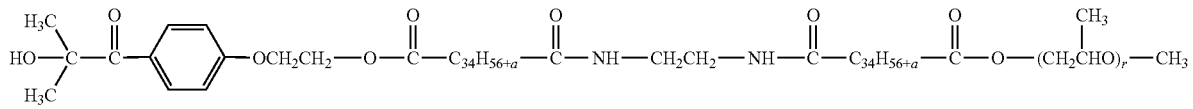

wherein —$C_{34}H_{56+a}$— each independently represents a branched alkylene group, wherein a is an integer from 0 to 12 and wherein r is an integer from 2 to 3.

11. The composition of claim 1, wherein each of the isoparaffinic hydrocarbon solvent and the alkane solvent have from about 10 to about 18 carbon atoms.

12. The composition of claim 1, wherein the alkane solvent is dodecane.

13. The composition of claim 1, wherein the composition further comprises an alcohol having from about 10 to about 18 carbon atoms.

14. A method of forming conductive features on a substrate, the method comprising:
providing a composition comprised of alkylamine stabilized silver nanoparticles, a gellant, an optional wax and a solvent;

depositing the composition onto the, substrate; and heating the composition on the substrate to a temperature from about 120° C. to about 250° C. to form conductive features on the substrate, wherein the solvent is selected from the group consisting of an isoparaffinic hydrocarbon, a mineral oil and an alkane solvent, and mixtures thereof, the conductivity of the conductive features on the substrate is from about 10 S/cm to about 10,000 S/cm, and a concentration of gellant in the composition is from about 0.1 weight percent to about 10 weight percent.

15. The method according to claim 14, wherein the gellant is a compound represented by the formula,

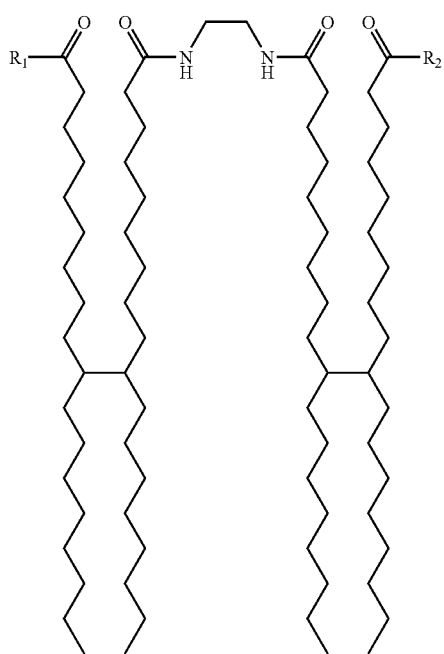

wherein $R_1$ and $R_2$ are side chains independently selected from the group consisting of a hydrogen atom, a hydrocarbon group, a heteroatom, and combinations thereof.

16. The method according to claim 15, wherein $R_1$ and $R_2$ each represent a phenol.

17. The method according to claim 14, wherein each of the isoparaffinic hydrocarbon solvent and the alkane solvent having from about 10 to about 18 carbon atoms.

18. The method according to claim 14, wherein a stabilizer in the alkylamine stabilized silver nanoparticles is an organoamine selected from the group consisting methylamine, ethyl amine, propylamine, butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and mixtures thereof.

19. The composition according to claim 1, wherein the composition has a solubility parameter of less than 21 $(MPa)^{1/2}$.

* * * * *